United States Patent
Bourke, Jr. et al.

(10) Patent No.: US 10,847,666 B2
(45) Date of Patent: Nov. 24, 2020

(54) UP AND DOWN CONVERSION SYSTEMS FOR IMPROVED SOLAR CELL PERFORMANCE OR OTHER ENERGY CONVERSION

(75) Inventors: Frederic A. Bourke, Jr., Greenwich, CT (US); Zak Fathi, Raleigh, NC (US); Ian Nicholas Stanton, Durham, NC (US); Michael J. Therien, Durham, NC (US)

(73) Assignees: Immunolight, LLC, Detroit, MI (US); Duke University, Durham, NC (US)

( * ) Notice: Subject to any disclaimer, the term of this patent is extended or adjusted under 35 U.S.C. 154(b) by 1104 days.

(21) Appl. No.: 12/891,466

(22) Filed: Sep. 27, 2010

(65) Prior Publication Data
US 2011/0126889 A1    Jun. 2, 2011

Related U.S. Application Data

(60) Provisional application No. 61/246,005, filed on Sep. 25, 2009.

(51) Int. Cl.
*H01L 31/055*    (2014.01)

(52) U.S. Cl.
CPC ............ *H01L 31/055* (2013.01); *Y02E 10/52* (2013.01)

(58) Field of Classification Search
CPC .... H01L 31/055; H01L 31/0232; H01L 33/06
USPC ........................................................ 136/257
See application file for complete search history.

(56) References Cited

U.S. PATENT DOCUMENTS

| | | | |
|---|---|---|---|
| 2,780,765 A | * | 2/1957 | Chapin ..................... H02J 7/35 |
| | | | 136/261 |
| 4,096,387 A | | 6/1978 | Buckley |
| 5,038,031 A | | 8/1991 | Kurosawa et al. |
| 5,828,118 A | | 10/1998 | Russell |

(Continued)

FOREIGN PATENT DOCUMENTS

| | | |
|---|---|---|
| EP | 2 067 838 A1 | 6/2009 |
| WO | WO 01/06257 A1 | 1/2001 |

(Continued)

OTHER PUBLICATIONS

Strumpel et al., Modifying the solar spectrum to enhnace silicon solar cell efficiency—an overview of available materials, 2007, Solar Energy Materials and Solar Cells, 91, 238-249.*

(Continued)

*Primary Examiner* — Shannon M Gardner
(74) *Attorney, Agent, or Firm* — Oblon, McClelland, Maier & Neustadt, L.L.P.

(57) ABSTRACT

A system and a conversion element for power conversion. The power conversion system includes a power conversion device which produces electric power upon illumination and includes a light conversion device which down-converts and up-converts a radiant source of energy into a specific energy spectrum for the illumination of the power conversion device. The conversion element includes a first plurality of particles which upon radiation from a first radiation source radiate at a higher energy than the first radiation source, and includes a second plurality of particles which upon radiation from the first radiation source radiate at a lower energy than the first radiation source. At least one of the first plurality of particles and the second plurality of particles can be at least partially metal coated.

3 Claims, 22 Drawing Sheets

(56) References Cited

U.S. PATENT DOCUMENTS

| | | | |
|---|---|---|---|
| 6,333,458 | B1 | 12/2001 | Forrest et al. |
| 6,667,471 | B2 | 12/2003 | Bos et al. |
| 7,075,225 | B2 | 7/2006 | Baroky et al. |
| 7,332,344 | B2 | 2/2008 | Morgan |
| 7,501,092 | B2 | 3/2009 | Chen |
| 7,589,880 | B2 | 9/2009 | Kempa |
| 7,605,327 | B2 | 10/2009 | Roscheisen |
| 2002/0119485 | A1* | 8/2002 | Morgan ............ 435/6 |
| 2004/0014060 | A1 | 1/2004 | Hoheisel et al. |
| 2007/0059705 | A1 | 3/2007 | Lu et al. |
| 2007/0091634 | A1 | 4/2007 | Sakurada |
| 2007/0165186 | A1 | 7/2007 | Copner et al. |
| 2007/0295383 | A1 | 12/2007 | Li |
| 2008/0048102 | A1 | 2/2008 | Kurtz et al. |
| 2008/0094691 | A1* | 4/2008 | Monch ............ C09K 11/7772 359/326 |
| 2008/0210893 | A1 | 9/2008 | McCarthy |
| 2008/0236667 | A1 | 10/2008 | Naum |
| 2008/0305045 | A1* | 12/2008 | Kuniyil et al. ............ 424/9.1 |
| 2009/0025792 | A1 | 1/2009 | Naum |
| 2009/0056791 | A1 | 3/2009 | Pfenninger |
| 2009/0151785 | A1 | 6/2009 | Naum |
| 2009/0173371 | A1 | 7/2009 | Skoczenski |
| 2009/0173372 | A1 | 7/2009 | Carroll |
| 2009/0194160 | A1* | 8/2009 | Chin ............ H01G 9/20 136/256 |
| 2009/0251765 | A1 | 10/2009 | Miteva |
| 2010/0261263 | A1* | 10/2010 | Vo-Dinh ............ A61L 2/08 435/287.1 |

FOREIGN PATENT DOCUMENTS

| | | |
|---|---|---|
| WO | WO 2008/048190 A1 | 4/2008 |
| WO | WO 2009/114620 A2 | 9/2009 |

OTHER PUBLICATIONS

Pillai et al., Surface plasmon enhanced silicon solar cells, J of Appl Physics 101, 2007.*

Debnath et al., Synthesis and luminescence properties of an Er2Te4O11 nanocrystals dispersed highly efficient upconverting lead free tellurite glass, Chemical Physics Letters, 474, 2009, 331-335.*

International Search Report dated Feb. 4, 2011 in Application No. PCT/US2010/050377.

T. J. Carrig, et al., "Upconversion Processes in Yb-Sensitized Tm:ZBLAN", Los Alamos National Laboratory, Retrieved from URL <http://www.osti.gov/bridge/purl.cover.jsp;jsessionid=AA5577080B4A4D7A02C534BEBCCDC5DA?purl=/389082-hDvcpK/webviewable/>, Sep. 9, 1996, 15 pages.

DeVosa et al., Modelling of Solar Cells with Down-Conversion of High Energy Photons, Anti-reflection Coatings and Light Trapping, vol. 50, Iusse 2, Feb. 2009, pp. 328-336.

V. Svrcek et al., Silicon Nanocrystals as Light Converter for Solar Cells, vols. 451-452, Mar. 22, 2004, pp. 384-388.

B.S. Richards, Luminescent Layers for Enhanced Silicon Solar Cell Performance: Down-Conversion, vol. 90, Issue 9, May 23, 2006, pp. 1189-1207.

E. Moulin et al., Thin-Film Silicon Solar Cells With Integrated Silver Nanoparticles, Thin Solid Films, v 516 n 20, Aug. 2008, p. 6813-6817.

Brongersma, et al., Nanostructured Metal-Organic Composite Solar Cells, Stanford University, GCEP Technical Report, 2009, p. 1-7.

Photovoltaic Cell Characteristics of Hybrid Silicon Devices With Lanthanide Complex Phosphorcoating Film, Journal of the Electrochemical Society, vol. 144, No. 11 Nov. 1997. p. 4054-4058.

Alivisatos, A.P., Hybrid Nanorod-Polymer Solar Cell, National Renewable Energy Laboratory, University of California at Berkeley, Aug. 2003.

Zhang, X.D. et al., Synthesis and Characterization of NaYF4: Yb, Er Nanoparticles with Efficient Up-Conversion Fluorescence Based on New Type Solar Cells, Nanoelectronics Conference, p. 5-9, 2008.

Kamat, P., Quantum Dot Solar Cells: Semiconductor Nanocrystals As Light Harversters, University of Notre Dame, Dept. of Chemistry, Oct. 2008.

Lahoz, F., $Ho^{3+}$-Doped Nanophase Glass Ceramics for Efficiency Enhancement in Silicon Solar Cells, Optical Society of America, Optics Leters, vol. 33, No. 24, p. 2982-2984, Dec. 2008.

Nakayama, K. et al., Electrophoretically Deposited TiO2 Nanotube Light-Scattering Layers of Dye-Sensitized Solar Cells, Japanese Journal of Applied Physics, vol. 47, No. 8, p. 6610-6661, Aug. 2008.

De la Torre, J. et al., Using Silicon Nanostructures for the Improvement of Silicon Solar Cells' Efficiency, Thin Solid Films 511-512, p. 163-166, Jan. 2006.

Heijna, M. et al., Nanoimprint Lithography of Light Trapping Patterns in Sol-Gel Coatings for Thin Film Silicon Solar Cells, Proceedings of SPIE—vol. 7002, 70020C, Photonics for Solar Energy Systems II, Apr. 2008.

S. V. Boriskina, G. Chen, "Exceeding the solar cell Shockley-Queisser limit via thermal up-conversion of low-energy photons," Optics Communications 314 (2014) pp. 71-78.

D. Wu et al., "Upconverting Electrodes for Improved Solar Energy Conversion" Department of Chemistry, Stanford University, Annual Report dated Apr. 22, 2012, 7 pgs.

Y. Chen, T. Chen, "Improvement of conversion efficiency of silicon solar cells using up-conversion molybdate $La_2Mo_2O_9$:Yb,R (R=Er, Ho) phosphors," Science Direct, Journal of Rare Earths, vol. 29, No. 8, Aug. 2011,pp. 723-726.

W. Zou et al., "Broadband dye-sensitized upconversion of near-infrared light," Nature Photonics, vol. 6, Aug. 2012, pp. 560-564.

W. Dong-Feng et al., "Hydrothermal synthesis of hexagonal-phase NaYF4: Er, Yb with different shapes for application as photovoltaic up-converters*," Chinese Physical Society and IOP Publishing Ltd, vol. 22, No. 2 (2013) pp. 027801 1-7.

W. van Sark et al., "Upconversion in solar cells," Nanoscale Research Letters 2013, 8:81, pp. 1-10.

M. Zeman et al., "Advanced Light Management Approaches for Thin-Film Silicon Solar Cells," Science Direct, Energy Procedia 15 (2012) pp. 189-199.

Combined Office Action and Search Report dated Nov. 24, 2015 in Taiwanese Patent Application No. 099132665 (with English translation of Search Report).

* cited by examiner

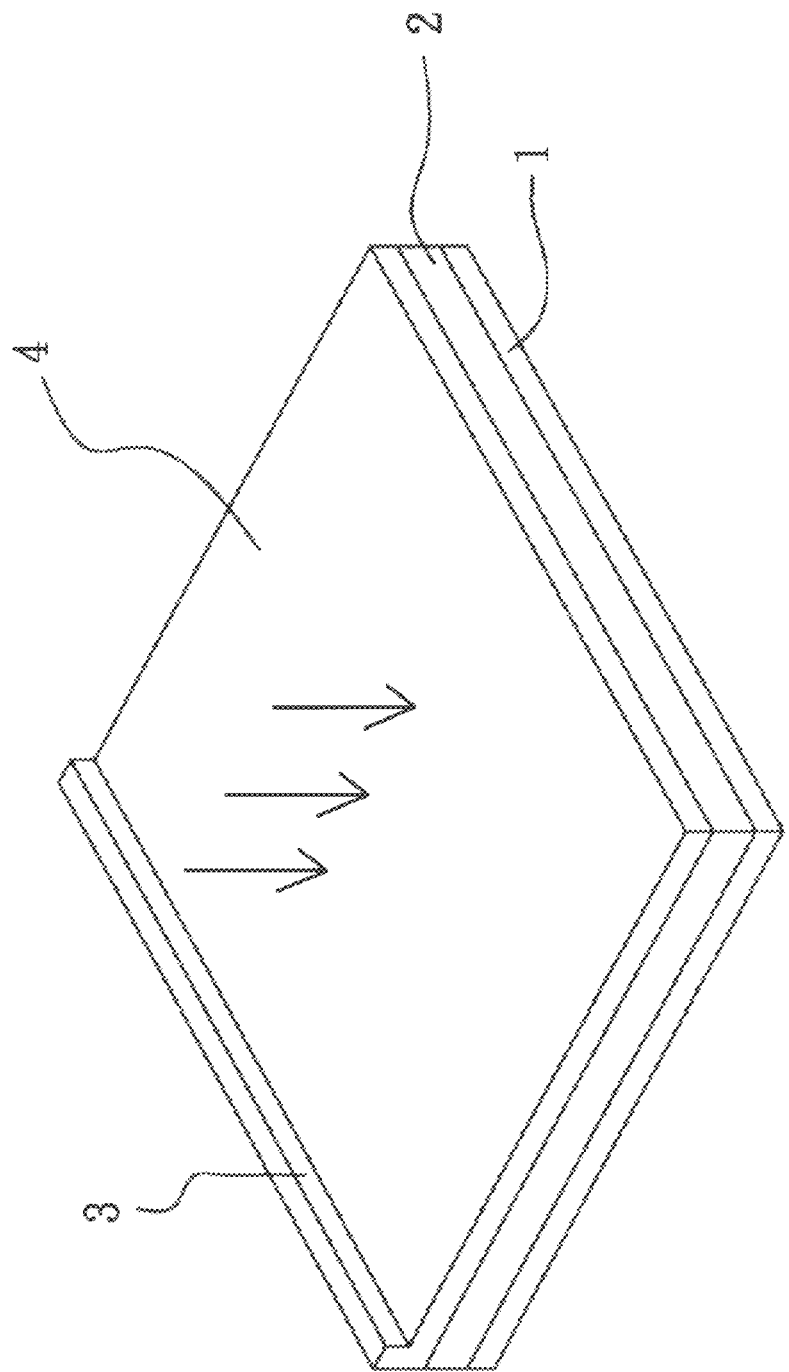

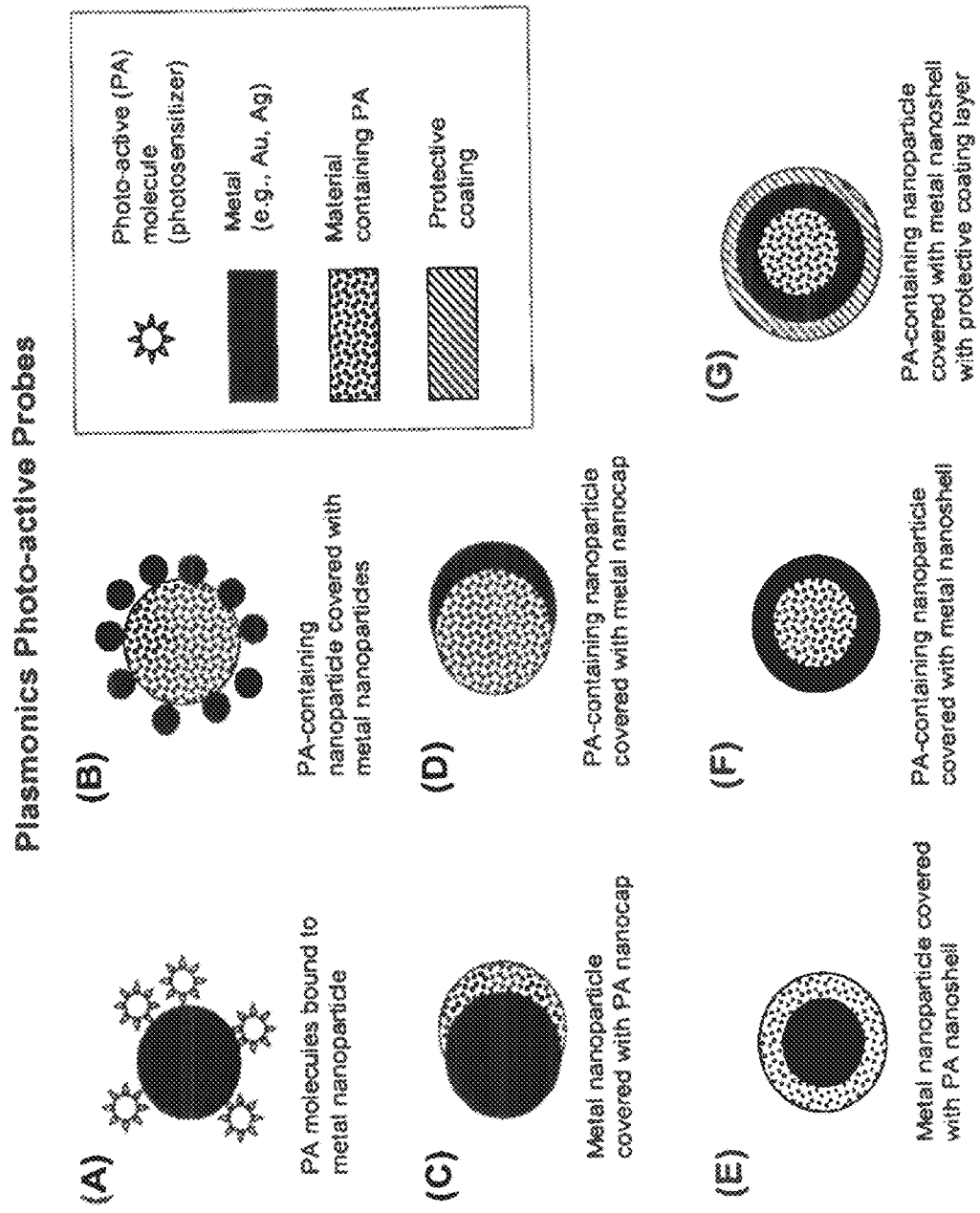

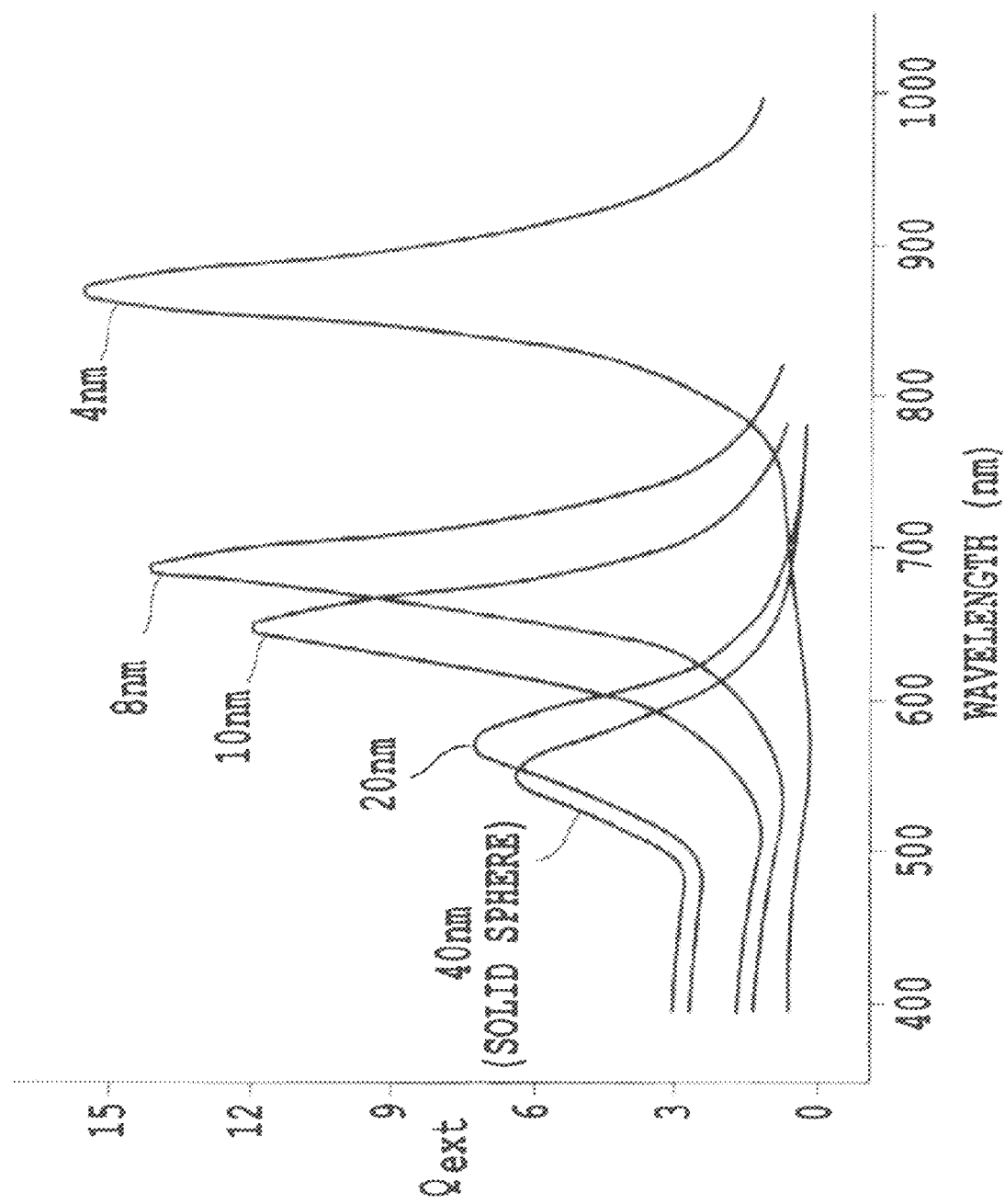

$Y_2O_3 = Y_2O_3, Y_2O_3:Ln; sub 5-nm.$
Au(Ag,Pt)shell=monolayer to x nm

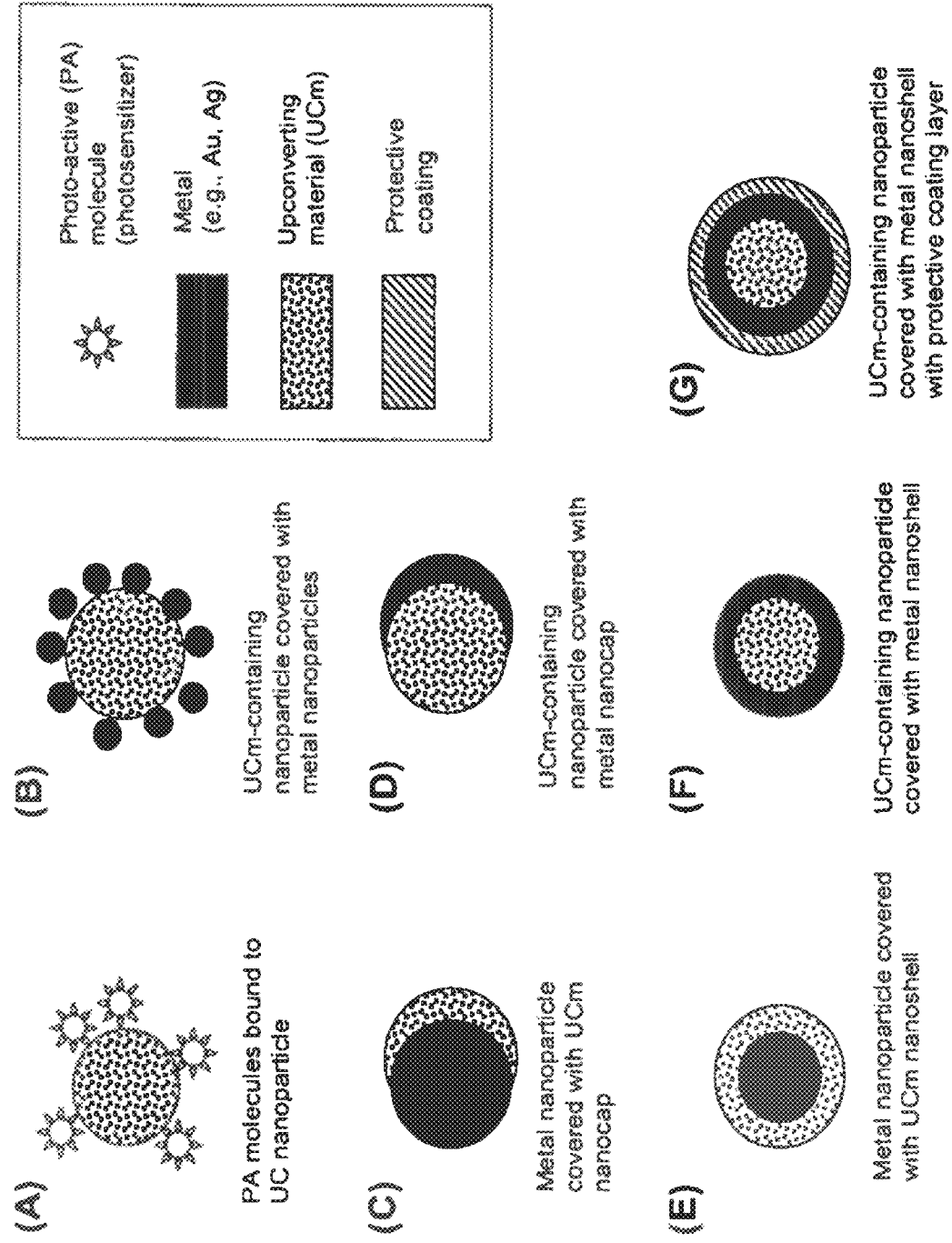

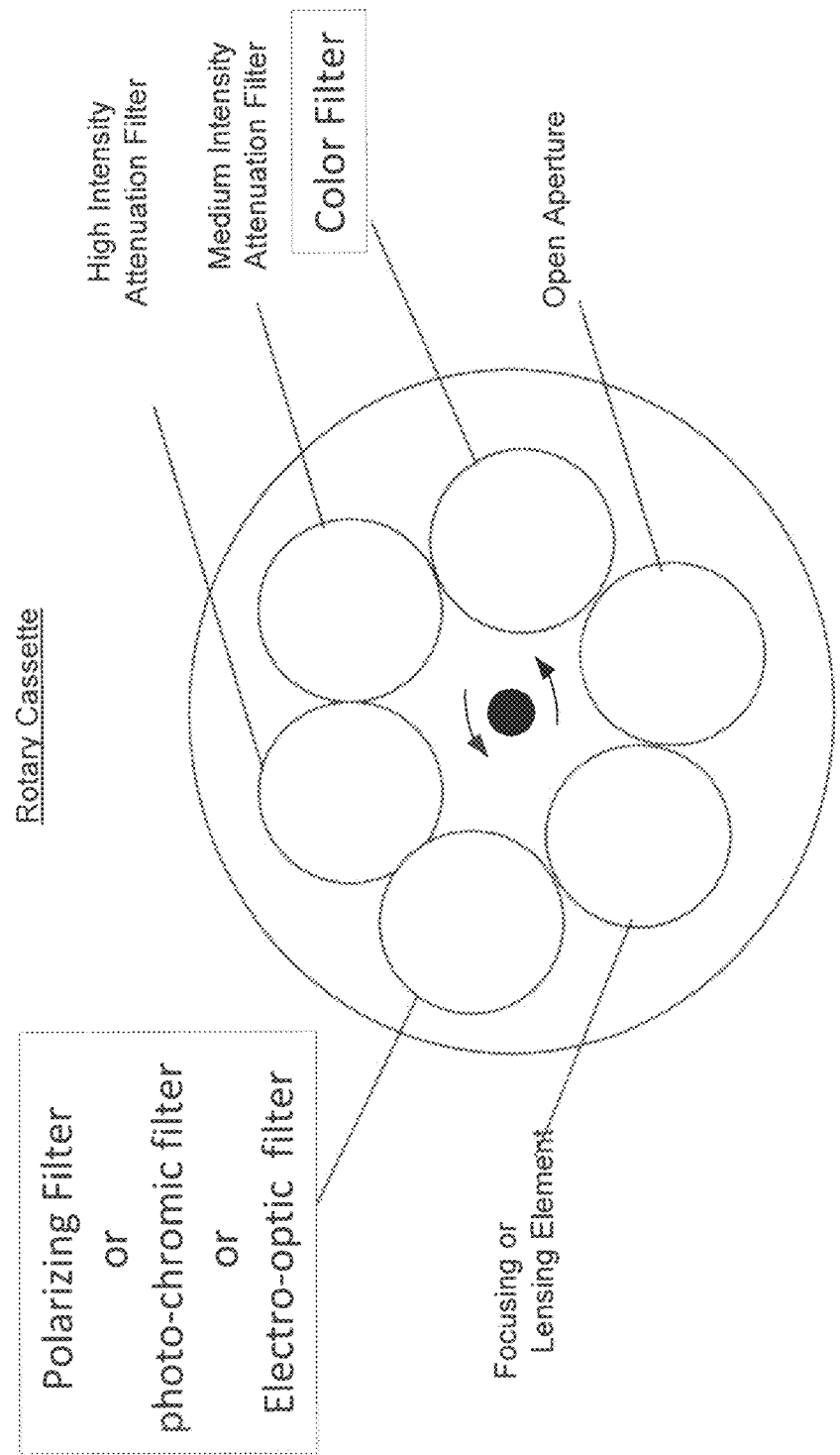

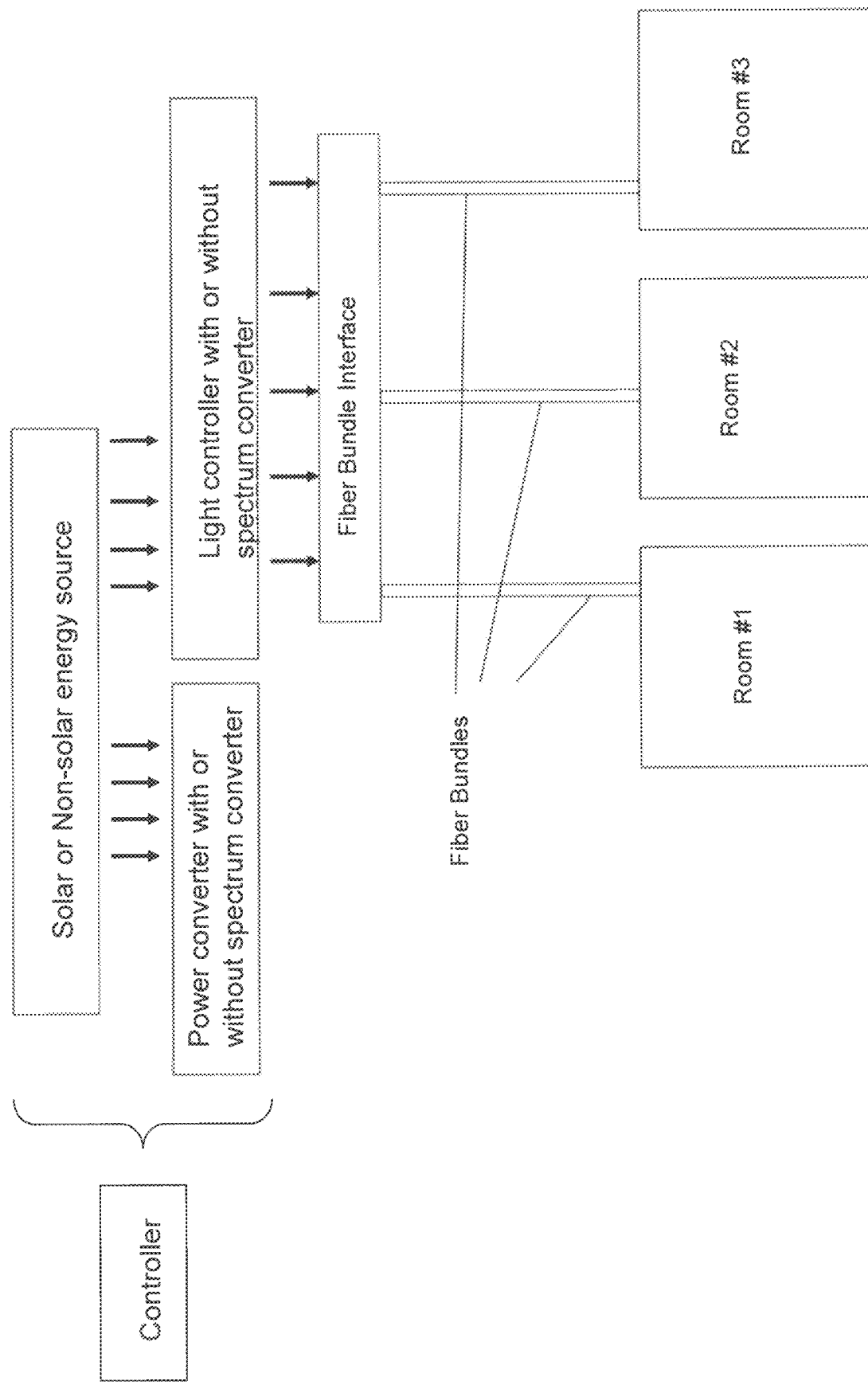

Figure 11

Module Cost Per Watt

| Technology | Substrate | Junction | Module Efficiency | Cost Per Watt 2011 | Cost Per Watt 2016 | Cost Per Watt 2021 | Production |
|---|---|---|---|---|---|---|---|
| a-Si (1x) | rigid glass | Single | 0.06 | $ 1.41 | $ 1.07 | $ 0.83 | Hi Volume |
| a-Si (3x) | flexible steel | Triple | 0.078 | $ 1.42 | $ 1.08 | $ 0.85 | Hi Volume |
| aSi/mcSi (2x) | rigid glass | Dual | 0.085 | $ 1.08 | $ 0.79 | $ 0.63 | Hi Volume |
| CdTe | rigid glass | Single | 0.095 | $ 0.98 | $ 0.71 | $ 0.54 | Hi Volume |
| CIGS | rigid glass | Single | 0.1 | $ 1.19 | $ 0.81 | $ 0.62 | Limited |
| CIGS | flexible steel | Single | 0.095 | $ 1.25 | $ 0.83 | $ 0.62 | N/A |
| Organic Dye | rigid flexible | Single | 0.05 | | | | N/A |
| c-Si | Rigid Si wafers | Single | 0.131 | $ 1.20 | $ 1.38 | $ 1.10 | Hi Volume |

US 10,847,666 B2

UP AND DOWN CONVERSION SYSTEMS FOR IMPROVED SOLAR CELL PERFORMANCE OR OTHER ENERGY CONVERSION

CROSS REFERENCE TO RELATED APPLICATIONS

This application is related to Provisional Application Ser. No. 60/954,263, filed Aug. 6, 2007, and 61/030,437, filed Feb. 21, 2008, and U.S. application Ser. No. 12/059,484, filed Mar. 31, 2008, the contents of which are hereby incorporated herein by reference. This application is also related to U.S. application Ser. No. 11/935,655, filed Nov. 6, 2007; and Provisional Application Ser. No. 61/042,561, filed Apr. 4, 2008; 61/035,559, filed Mar. 11, 2008, and 61/080,140, filed Jul. 11, 2008, the contents of which are hereby incorporated herein by reference. This application is related to Provisional Application Ser. No. 61/161,328, filed Mar. 18, 2009, the contents of which are hereby incorporated herein by reference. This application is related to Provisional Application Ser. No. 61/371,549, filed Aug. 6, 2010, the contents of which are hereby incorporated herein by reference.

This application is related to and claims priority under 35 U.S.C. § 119(e) to Provisional Application Ser. No. 61/246,005, filed Sep. 25, 2009, the contents of which are hereby incorporated herein by reference.

BACKGROUND OF THE INVENTION

Field of Invention

The invention relates to methods and systems for improving the efficiency of solar cells and other photoelectric conversion devices receiving broad band light or radiant energy from a source not optimized for photoelectric conversion.

Discussion of the Background

A conventional solar cell uses monocrystalline silicon to convert solar radiation into usable energy. Other semiconductor materials besides silicon can be used, and these materials (including silicon) can exist in the solar cell in amorphous or polycrystalline form. Organic materials can also be used for solar cell conversion. Tandem solar cell arrangements are also used which include different semiconductor materials where each layer in the tandem is made of a specific band gap material designed to "match" better the solar cell the sun's spectrum of light.

A solar cell covered on monocrystalline silicon is usually a p-type semi-conductive monocrystalline silicon wafer, which is realized by doping boron compound into a monocrystalline silicon. Antimony or other suitable n-type dopant is included in the silicon to form a form p-n junction typically a layer on or near the silicon surface to be exposed to the sun's light. The thickness of n-type layer is usually from 0.5-3 µm. The n-type layer is connected to a contact electrode (e.g., gold or an alloy thereof or a transparent metal oxide such as indium tin oxide) on its front surface. The back of the silicon wafer is usually completely covered with a metal electrode or silver deposited electrode.

When a solar cell device is excited by the radiation of the sun or artificial light, the photons absorbed by semiconductor material result in unbalanced hole-electron pair production. At this moment, the electrons in the p-layer close to the p-n junction drift to the boundary at the p-n junction and are attracted into the n-type junction by the self-imposed electric field existing across the p-n junction. The holes (p-type carriers) in the n-type junction will partially drift into the interior, i.e. the p-type region. This drifts results in adding extra negative charges into the n-type material and adding extra positive charges into the p-type material, leading to a voltage for an outside circuit. A semiconductor power source of this kind has the n-type junction as the cathode and p-type junction as the anode. The effective working efficiency of the simplest framework of this kind of solar cell assembly is 15 to 16%.

FIG. 1 shows that the basic framework of a conventional solar cell, wherein 1 is a P-type monocrystalline silicon wafer, 2 is an n-type conductive layer, 3 is an electrode system, and 4 is an outer anti-reflection coating. The silicon wafer of the solar cell is usually covered with dustproof housing made of vinyl acetate or polycarbonate-like compound.

According to the solar radiation spectrum measured in the medium latitude region (at northern latitude 48°, for example), when the Sun is 45° above the horizon, the maximum-energy wavelength of the solar spectrum reaching the earth surface is between 290-1060 nm. When a solar cell works in the near-space environment, the complete spectrum also contains the short-wavelength radiation of UV and VUV and the medium-wavelength radiation of far-red longer than 1065 nm.

However, the energy distribution of the solar radiation spectrum is uneven. The maximum energy of the solar radiation appears in the blue light ($\lambda$=470 nm). The solar radiation is reduced by 20% in the main section of visible light between the wavelength 500-600 nm, and the corresponding radiation is half at $\lambda$=720 nm. Furthermore, the radiation at $\lambda$=1000 nm=1 µm is only ⅕ of the maximum value.

FIG. 2 shows the sensitivity of the standard spectral curve of a solar cell sample at each wavelength range corresponding to the solar spectrum. By inspection of the data in FIG. 2, at the wavelength range between $\lambda$=950-980 nm, the silicon solar cell assembly is most responsive with the maximum sensitivity because the energy band structure of the monocrystalline silicon has a bandgap Eg of 1.21 ev, which corresponds to the wavelength of $\lambda$=950 nm. On the other hand, the solar cell assembly is virtually non-responsive to the ultraviolet ($\lambda$<4 00 nm), i.e. silicon cannot efficiently convert this ultraviolet light.

Solar cells operate as quantum energy conversion devices, and are therefore subject to the "Thermodynamic Efficiency Limit." Photons with an energy below the band gap of the absorber material cannot generate a hole-electron pair, and so their energy is not converted to useful output and only generates heat if absorbed. For photons with an energy above the band gap energy, only a fraction of the energy above the band gap can be converted to useful output. When a photon of greater energy is absorbed, the excess energy above the band gap is converted to kinetic energy of the carrier combination. The excess kinetic energy is converted to heat through phonon interactions as the kinetic energy of the carriers slows to equilibrium velocity.

The overall effect of temperature on cell efficiency can be computed. Most crystalline silicon solar cells decline in efficiency by 0.50%/° C. and most amorphous cells decline by 0.15-0.25%/° C.

Solar cell efficiencies vary from 6% for amorphous silicon-covered solar cells to 40.7% with multiple-junction (or tandem) cells and 42.8% with multiple dies assembled into a hybrid package Solar cell energy conversion efficiencies for commercially available multicrystalline Si solar cells are around 14-19%. The highest efficiency cells have not always been the most economical—for example a 30% efficient multijunction cell covered on materials such as gallium arsenide or indium selenide and produced in low volume might well cost one hundred times as much as an 8% efficient amorphous silicon cell in mass production, while only delivering about four times the electrical power.

However, there is a way to "boost" solar power. By increasing the light intensity, typically photo generated carriers are increased, resulting in increased efficiency by up to 15%. These so-called "concentrator systems" have only begun to become cost-competitive as a result of the development of high efficiency GaAs cells. The increase in intensity is typically accomplished by using concentrating optics. A typical concentrator system may use a light intensity 6-400 times the sun, and increase the efficiency of a one sun GaAs cell from 31% at AM 1.5 to 35%. Most commercial producers are developing systems that concentrate between 400 and 1000 suns.

For a long time, researchers have strived to overcome the defects and limitations described above. FIG. 3 shows one prior approach in which a solar cell is covered with a layer of monocrystalline ruby including $Cr^{+3}$, which can enhance the absorption of the solar radiation in the wavelength range of 2.3 ev~3.2 ev. The physical significance of this design is that, by coating a solar cell with a layer of monocrystalline ruby, the absorption of the solar radiation in the range of 2.3 ev~3.2 ev will be enhanced, because the $Cr^{+3}$ will be excited to induce d-d transitions and then cause the narrow band to emit light. FIG. 3 plots photon energy verse absorptivity. Curve 2 is the absorptivity of the excited $Cr^{+3}$, and curve 1 is the light emission from the excited monocrystalline ruby. Consequently, the peak wavelength of $Cr^{+3}$ in the ruby corresponds to $\lambda$=695 nm, and thus the original solar radiation is "moved" to a longer wavelength range by way of the short-wavelength range of the radiation being absorbed and re-emitted in the wavelength range of $\lambda$=700 nm.

FIG. 3 is also marked with the carrier assembly coefficient (curve 3) of a monocrystalline silicon cell coated with an excitable ruby. The carrier assembly coefficient varies with whether the ruby layer is present or not. The carrier assembly coefficient of the directly-excited short wavelength of the solar radiation is 10-20% higher than that of a light-emitting device operated by a ruby converter. Accordingly, the efficiency of a monocrystalline silicon solar cell may increased by 0.5-2% with a ruby converter. Despite this demonstration, the high cost of monocrystalline ruby distracts from this approach.

Naum et al in U.S. Pat. Appl. Publ. Nos. 2007/0267058 and 2009/0156785 (the entire contents of which are incorporated herein by reference) describe a transparent light conversion film including phosphor materials to increase the overall efficiency of converting the incident solar light. Specifically, Naum et al focused only on the problem that, when the sunlight reaches the earth, about 6-8% of the energy is ultraviolet. The energy carried by ultraviolet cannot be absorbed by a solar cell to generate electric energy. Moreover, this energy can degrade and heat up the solar cell assembly, resulting in damaging the assembly and lowering its efficiency. Naum et al used a transparent phosphor powder which absorbed the ultraviolet in the wavelength $\lambda$<400 nm and re-radiated red light in the wavelength range $\lambda$=500~780 nm, thereby generating extra electricity and enhancing the conversion efficiency of the solar cell assembly.

Yet, in this work, only a portion of the solar spectrum above the band gap energy of the solar cell is converted.

SUMMARY OF THE INVENTION

The invention overcomes the problems and disadvantages of the prior art as described in the various embodiments below.

In one embodiment, there is provided a system for power conversion. The power conversion system includes a power conversion device which produces electric power upon illumination and includes a light conversion device which (i) down-converts, (ii) up-converts, or (iii) both down-converts and up-converts a radiant source of energy into a specific energy spectrum for illumination of the power conversion device.

In another embodiment, there is provided a conversion element. The conversion element includes a first plurality of particles which upon radiation from a first radiation source radiate at a higher energy than the first radiation source, and includes a second plurality of particles which upon radiation from the first radiation source radiate at a lower energy than the first radiation source. At least one of the first plurality of particles and the second plurality of particles can be at least partially metal coated.

It is to be understood that both the foregoing general description of the invention and the following detailed description are exemplary, but are not restrictive of the invention.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings, wherein:

FIG. 7A-1 is a schematic illustration of the capability to "tune" the metal shell to have a spectral overlap with the excitation and/or emission radiation wavelengths;

FIG. 7B is a schematic illustration of plasmon resonance as a function of shell thickness;

FIG. 9A is a schematic illustration of other various upconverter structures of the invention;

FIG. 10C is a schematic illustration showing a top view of a rotary cassette placed proximate to a solar panel level where light is transferred to a fiber bundle of the invention;

FIG. 10E is a schematic illustration of a system for lighting distribution from solar or non-solar light sources; and FIG. 11 is a table summarizing the cost per watt per module time over time for various PV technologies.

DETAILED DESCRIPTION OF THE INVENTION

Figure 2:
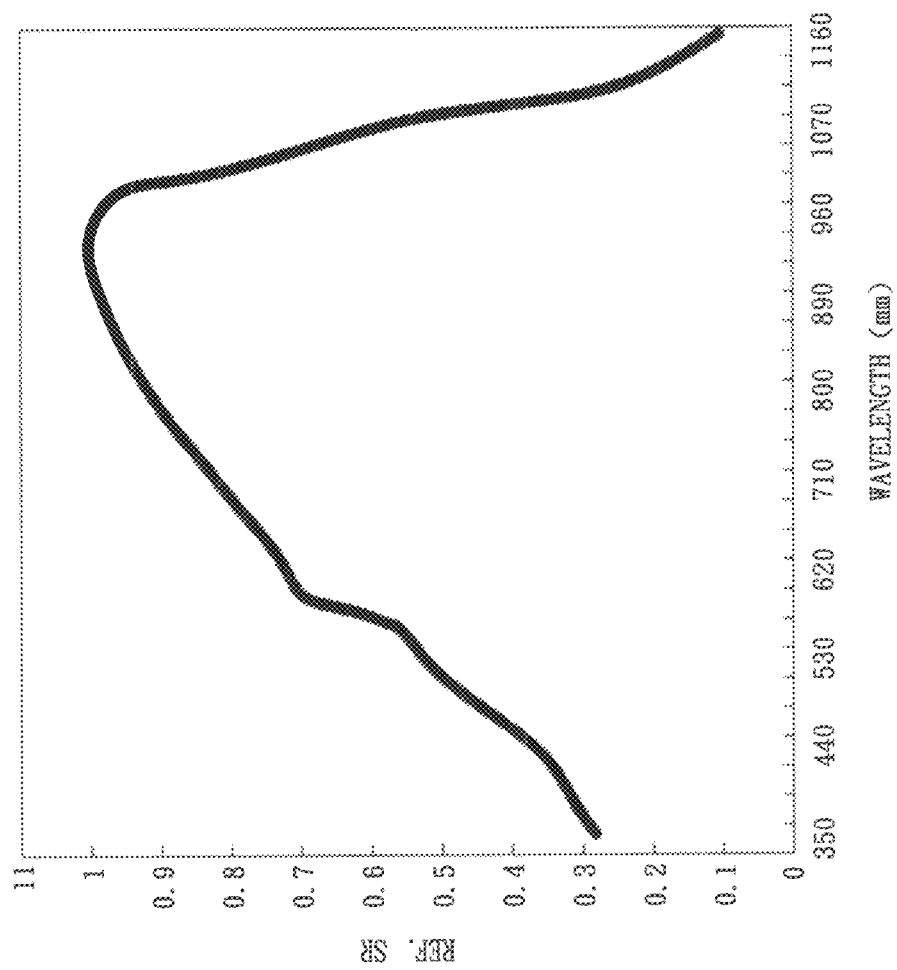
FIG. 2 schematically illustrates the sensitivity of the standard spectral curve of a solar cell sample at each wavelength range corresponding to the solar spectrum.
Figure 3:
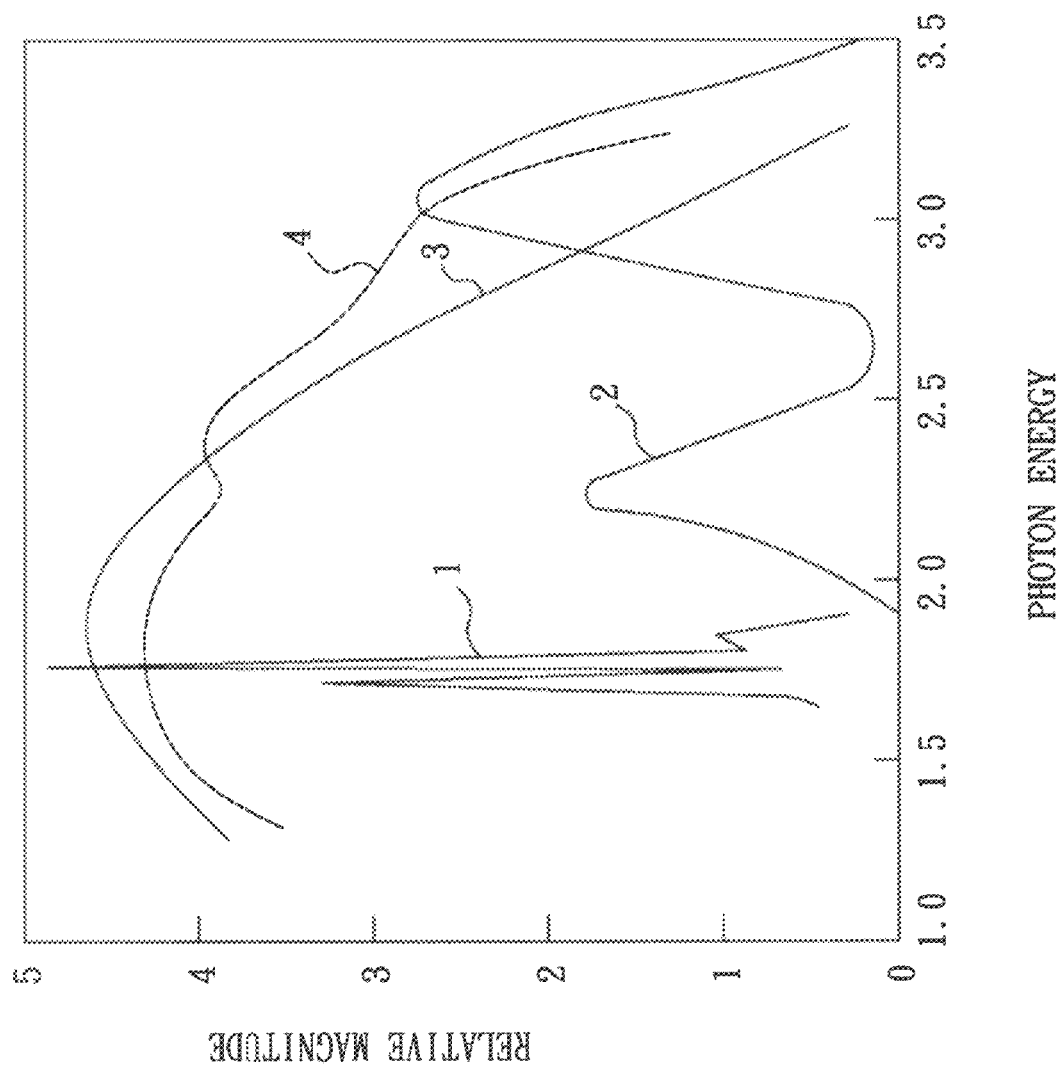
FIG. 3 schematically illustrates a solar cell covered with a layer of monocrystalline ruby, which can enhance the absorption of the solar radiation in the range of 2.3 ev~3.2 ev.
Figure 4:
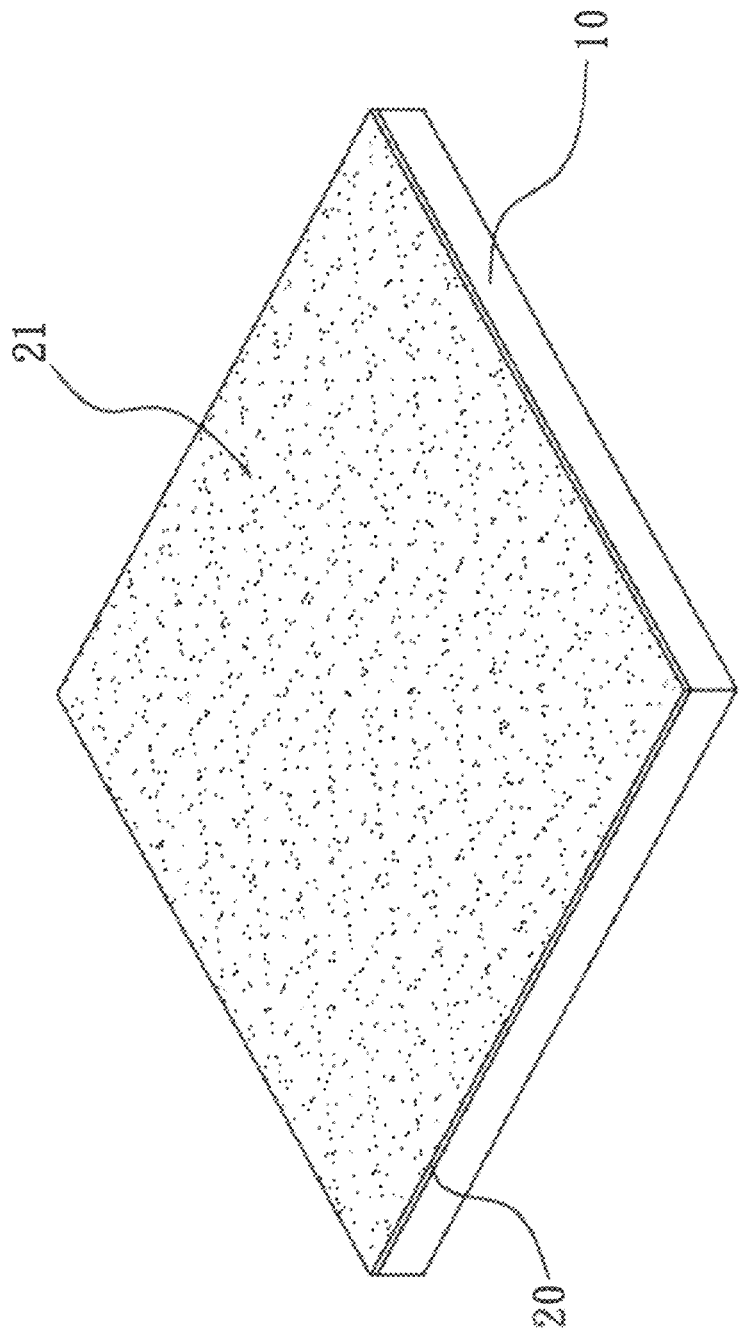
FIG. 4 schematically illustrates one solar cell structure of the present invention.

Reference will now be made in detail to the present preferred embodiment of the invention, an example of which is illustrated in the accompanying drawings, in which like reference characters refer to corresponding elements. FIG. 4 illustrates a power conversion system according to the present invention. With reference to FIG. 4, the power conversion system comprises a conversion element 10 and a conversion film 20.

In one embodiment of the invention, the power conversion system is exposed to solar radiation in terrestrial or extraterrestrial settings, and the solar energy is converted by the conversion film 20 into a wavelength or wavelengths where the conversion element 10 is designed to operate (e.g., the solar energy is converted to wavelengths close to the band gap energy of a semiconductor material in the conversion element 10).

In another embodiment of the invention, the power conversion system is exposed to high energy or ionizing radiation, and the high energy or ionizing radiation is converted by the conversion film 20 into a wavelength or wavelengths where the conversion element 10 is designed to operate. Ionizing radiation has the ability to strip electrons from atoms and break chemical bonds. There are three types of ionizing radiation: alpha, beta, and gamma. Alpha radiation is composed of a helium nucleus (two protons and two neutrons bound together). Beta radiation is composed of high-speed electrons or their positively charged counterparts (positrons). Gamma radiation, highly energetic light, differs from alpha and beta radiation because it is massless and uncharged. Gamma radiation often accompanies the emission of alpha or beta radiation from a particular radioisotope. Typical radiation sources which could be used in the present invention include a Cobalt 60 source, a Cesium-137 source, an Iridium-192 source, a Krypton-85 source, a Radium-226 source, and a Strontium-90 source. Other high energy or ionizing radiation sources could be used. Indeed, the present invention could be used in the peripheral regions of nuclear cores at nuclear electric power generators.

In another embodiment of the invention, the power conversion system is exposed to infrared radiation from a waste heat source or a combustion source, and the infrared radiation is converted by the conversion film 20 into a wavelength or wavelengths where the conversion element 10 is designed to operate.

The conversion element 10 is typically a photoelectric element and can be for example a monocrystalline silicon wafer such as a p-type monocrystalline silicon wafer, a p-type polycrystalline silicon wafer, an n-type monocrystalline silicon wafer, or an n-type polycrystalline silicon wafer. A p-type monocrystalline silicon wafer is selected here as an example for explanation. However, other photoelectric conversion elements are equally usable in the invention. Also, the conversion element 10 can include multiple conversion elements such as for example 16-20 silicon wafers (e.g., 120 mm diam. wafers), forming a parallel circuit and covering a large percentage of the area of the conversion element 10.

The conversion film 20 can be made in the form of a thin polymer layer, in which a number of up and down conversion particles 21 are disposed. The filled polymer layer can be contacted with or disposed in close proximity to the outer surface of the conversion element 10. The filled polymer layer by way of a mixture of different or the same down conversion particles 21 can enhance the absorption for a first specific wavelength range of the solar radiation, for example but not limited to, $\lambda<400$ nm, and re-radiate in a second specific wavelength range, for example but not limited to, 500-780 nm where in this example a crystalline silicon solar cell would be the most efficient. The filled polymer layer by way of a mixture of different or the same up conversion particles 21 can enhance the absorption for a first specific wavelength range of the solar radiation, for example but not limited to, $\lambda>1100$ nm, and re-radiate in a second specific wavelength range, for example but not limited to, 500-780 nm where in this example a crystalline silicon solar cell would be the most efficient. In one embodiment of the invention, a glass structure is used instead of the polymer layer.

For use with solar radiation, a cover material on the conversion film 20 can be made of a polycarbonate, and/or polysiloxanes, and/or acrylatepolymer. Alternatively, the cover material can be a glass compound including for example silica, phosphates, or metal oxides. The cover material on the conversion film 20 can have a high transmittance in a wide range of wavelength $\lambda=400\sim1200$ nm. For use with high energy radiation sources, the cover material can be a lead oxide glass to ensure that stray radiation not converted by the down conversion particles does not damage any of the components of the conversion element 10. For use with infrared radiation sources, the cover material can be an infrared transparent glass. For near-IR (NIR), from about 800 nm to 2500 nm, almost all silica-covered glasses as well as a variety of plastics and polycarbonates can be used. In fact, typical polycarbonates used in sunglasses are actually more transmissive in NIR than in the visible. For medium wavelength IR (MWIR), from 3000 to 5000 nm, sapphire, diamond, silicon, germanium, zinc selenide, zinc sulfide, magnesium fluoride, and other materials similar can be used. For long wavelength IR (LWIR), from 8000 to 14000 nm, germanium, silicon, zinc selenide, and some plastics can be used.

Down Converter Structures:

This invention in various embodiments uses a wide variety of down conversion materials (or mixtures of down converters) to produce a particular wavelength or spectrum of light which is well suited for electricity generation from a photoelectric conversion element optically coupled to the conversion film 20.

In one embodiment of the invention, one class of down conversion materials can be the materials such as those described in Naum et al. The chemical composition of one phosphor powder down-converter is formulated as, for example but not limited to, $(Sr_{1-x}Ba_x)(BO_2)_2EuLiCl$, where $0 \leq x \leq 1$; that Sr and Ba are partial or total substitution can be deduced from the range of x.

A phosphor powder down-converter can further include Eu, Li, or Cl. The addition of Eu is, for example but not limited to, 0.1~15%; Li, 0~15%; and Cl, 0.1~30%. One process for formation of these phosphor powder down-converters would be to use $Sr(OH)_2$, $Ba(OH)_2$, $H_3BO_3$, $Eu_2O_3$, LiOH, $NH_4Cl$ as raw materials, and thoroughly mix these materials in a prescribed ratio. The mixture would then be fired in a module with different steps, e.g., a first step at temperature to 550~650° C. and remain isothermal for 1 to 2 hours; then in a second step, heating to 1000~1300° C. and remaining isothermal for 1 to 3 hours, for example. The material upon cooling would be a usable phosphor powder down-converter of the invention for inclusion with one of the other converter materials.

Other down converters known in the art include $TiO_2$, ZnO, $Fe_2O_3$, CdTe, CdSe, ZnS, CaS, BaS, SrS and $Y_2O_3$. Other suitable down conversion materials known in the art include zinc sulfide, $ZnS:Mn^{2+}$, ferric oxide, titanium oxide, zinc oxide, zinc oxide containing small amounts of $Al_2O_3$ and AgI nanoclusters encapsulated in zeolite. Other suitable down conversion materials include lanthanum and gadolinium oxyhalides activated with thulium; $Er^{3+}$ doped $BaTiO_3$ nanoparticles, $Yb^{3+}$ doped $CsMnCl_3$ and $RbMnCl_3$, $BaFBr:Eu^{2+}$ nanoparticles, Cesium Iodine, Bismuth Germanate, Cadmium Tungstate, and CsBr doped with divalent Eu.

In various embodiments of the invention, the following luminescent polymers known in the art are also suitable as conversion materials: poly(phenylene ethynylene), poly(phenylene vinylene), poly(p-phenylene), poly(thiophene), poly(pyridyl vinylene), poly(pyrrole), poly(acetylene), poly(vinyl carbazole), poly(fluorenes), and the like, as well as copolymers and/or derivatives thereof.

In various embodiments of the invention, the following particles can be used similar to that detailed in U.S. Pat. No. 7,090,355, the entire contents of which are incorporated herein by reference. For down-conversion, the following materials can be used: inorganic or ceramic phosphors or nano-particles, including but not limited to metal oxides, metal halides, metal chalcoginides (e.g. metal sulfides), or their hybrids, such as metal oxo-halides, metal oxo-chalcoginides; laser dyes and small organic molecules, and fluorescent organic polymers; semiconductor nano-particles, such as II-VI or III-V compound semiconductors, e.g. fluorescent quantum dots; organometallic molecules including at least a metal center such as rare earth elements (e.g. Eu, Tb, Ce, Er, Tm, Pr, Ho) and transitional metal elements such as Cr, Mn, Zn, Ir, Ru, V, and main group elements such as B, Al, Ga, etc. The Garnet series of phosphors can be used: $(Y_mA_{1-m})_3(Al_nB_{1-n})_5O_{12}$, doped with Ce; where $0 \leq m$, $n \leq 1$, where A includes other rare earth elements, B includes B, Ga. In addition, phosphors containing metal silicates, metal borates, metal phosphates, and metal aluminates hosts can be used. In addition, phosphors containing common rare earth elements (e.g. Eu, Tb, Ce, Dy, Er, Pr, Tm) and transitional or main group elements (e.g. Mn, Cr, Ti, Ag, Cu, Zn, Bi, Pb, Sn, Tl) as the fluorescent activators, can be used. Materials such as Ca, Zn, Cd in tungstates, metal vanadates, ZnO, etc. can be used.

Commercial laser dyes obtainable from several laser dye vendors, including Lambda Physik, and Exciton, etc can be used. A partial list of laser dye classes includes: Pyrromethene, Coumarin, Rhodamine, Fluorescein, other aromatic hydrocarbons and their derivatives, etc. In addition, there are many polymers containing unsaturated carbon-carbon bonds, which also serve as fluorescent materials and find many optical and fluorescent applications. For example, MEH-PPV, PPV, etc have been used in opto-electronic devices, such as polymer light emitting diodes (PLED).

As noted above, quantum dots or semiconductor nano-particles can be used. The term "semiconductor nanoparticles," in the art refers to an inorganic crystallite between 1 nm and 1000 nm in diameter, preferably between 2 nm to 50 nm. A semiconductor nano-particle is capable of emitting electromagnetic radiation upon excitation (i.e., the semiconductor nano-particle is luminescent). The nanoparticle can be either a homogeneous nano-crystal, or comprises of multiple shells. For example, the nanoparticle can include a "core" of one or more first semiconductor materials, and may be surrounded by a "shell" of a second semiconductor material. The core and/or the shell can be a semiconductor material including, but not limited to, those of the group II-VI (ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and the like) and III-V (GaN, GaP, GaAs, GaSb, InN, InP, InAs, InSb, and the like) and IV (Ge, Si, and the like) materials, and an alloy or a mixture thereof.

Fluorescent organometallic molecules containing rare earth or transitional element cations can be used for down conversion. Such molecules include a metal center of rare earth elements including Eu, Tb, Er, Tm, Ce protected with organic chelating groups. The metal center may also include transitional elements such as Zn, Mn, Cr, Ir, etc and main group elements such as B, Al, Ga. Such organometallic molecules can readily dissolved in liquid or transparent solid host media. Some examples of such fluorescent organometallic molecules include: 1. Tris(dibenzoylmethane)mono(phenanthroline)europium(III); 2. Tris(8-hydroxyquinoline)erbium; 3. Tris(1-phenyl-3-methyl-4-(2,2-dimethylpropan-1-oyl)pyrazolin-5-one)terbium(III); 4. Bis(2-methyl-8-hydroxyquinolato)zinc; 5. Diphenylborane-8-hydroxyquinolate.

Specific examples of down-converting particles for red emission (e.g., near the band gap of a crystalline silicon solar cell) include those discussed above and europium complexes such as those described in JP Laid-open Patent Publication (Kokai) No. 2003-26969, which were constructed such that β-diketone ligand is coordinated to europium forming an europium complex capable of emitting red fluorescence. Other specific examples of the rare earth element complexes include complexes include lanthanum (Ln), europium (Eu), terbium (Tb), and gadolinium (Gd) and combinations thereof. An europium (Eu) complex is capable of emitting red fluorescence when irradiated with ultraviolet rays having a wavelength ranging from 365 nm to 410 nm. Terbium (Tb) is capable of emitting green or yellow fluorescence when irradiated with ultraviolet rays having a wavelength of 365 nm and may be useful for example in higher bandgap solar cells, such as for example amorphous silicon solar cells or GasAs based or other II-V-based solar cells.

In other down-conversion embodiments, light emitting particles which emit red light can include europium, light emitting particles which emit green light can include Terbium, and light emitting particles which emit blue or yellow light can include cerium (and/or thulium). In embodiments, light emitting particles can be included in pure organic or organo-metallic dyes.

In addition to the combinations of rare earth complexes, such as a combination of a europium complex and a terbium complex, it is also possible employ a combination of a europium substance and a green-emitting fluorescent substance which is not a complex, or a combination of a terbium substance and a red-emitting fluorescent substance which is not a complex.

Such combinations may be advantageous for cascade-type or tandem-type solar cells where one cell is designed to convert a higher energy of light to electricity than another cell designed to convert a lower energy of light to electricity.

Other down converters include for example ZnS, PbS, SbS$_3$, MoS$_2$, PbTe, PbSe, BeO, MgO, Li$_2$CO$_3$, Ca(OH)$_2$, MoO$_3$, SiO$_2$, Al$_2$O$_3$, TeO$_2$, SnO$_2$, KBr, KCl, and NaCl. These materials can include dopants to tailor the emission properties. Examples of doped (or alloyed) glass systems suitable for the include Y$_2$O$_3$:Gd, Y$_2$O$_3$:Dy, Y$_2$O$_3$:Tb, Y$_2$O$_3$:Ho, Y$_2$O$_3$:Er, Y$_2$O$_3$:Tm, Gd$_2$O$_3$:Eu, Y$_2$O$_2$S:Pr, Y$_2$O$_2$S:Sm, Y$_2$O$_2$S:Eu, Y$_2$O$_2$S:Tb, Y$_2$O$_2$S:Ho, Y$_2$O$_2$S:Er, Y$_2$O$_2$S:Dy, Y$_2$O$_2$S:Tm, ZnS:Ag:Cl (blue), ZnS:Cu:Al (green), Y$_2$O$_2$S:Eu (red), Y$_2$O$_3$:Eu (red), YVO$_4$:Eu (red), and Zn$_2$SiO$_4$:Mn (green).

Alternatively, quantum dots (as described above) can be used to tailor the down conversion process. As described in U.S. Pat. No. 6,744,960 (the entire contents of which are incorporated by reference), different size quantum dots produce different wavelength emissions. As applicable to this invention, quantum dots can comprise various materials including semiconductors such as zinc selenide (ZnSe), cadmium selenide (CdSe), cadmium sulfide (CdS), indium arsenide (InAs), and indium phosphide (InP). Another material that may suitably be employed is titanium dioxide (TiO$_2$). The size of the particle, i.e., the quantum dot, may range from about 2 to 10 nm. Since the size of these particles is so small, quantum physics governs many of the electrical and optical properties of the quantum dot. One such result of the application of quantum mechanics to the quantum dot is that quantum dots absorb a broad spectrum of optical wavelengths and re-emit radiation having a wavelength that is longer than the wavelength of the absorbed light. The wavelength of the emitted light is governed by the size of the quantum dot. For example, CdSe quantum dots 5.0 nm in diameter emit radiation having a narrow spectral distribution centered about 625 nm while quantum dots 18 including CdSe 2.2 nm in size emit light having a center wavelength of about 500 nm. Semiconductor quantum dots comprising CdSe, InP, and InAs, can emit radiation having center wavelengths in the range between 400 nm to about 1.5 μm. Titanium dioxide TiO$_2$ also emits in this range. The linewidth of the emission, i.e., full-width half-maximum (FWHM), for these semiconductor materials may range from about 20 to 30 nm. To produce this narrowband emission, quantum dots simply need to absorb light having wavelengths shorter than the wavelength of the light emitted by the dots. For example, for 5.0 nm diameter CdSe quantum dots, light having wavelengths shorter than about 625 nm is absorbed to produce emission at about 625 nm while for 2.2 nm quantum dots comprising CdSe light having wavelengths smaller than about 500 nm is absorbed and re-emitted at about 500 nm.

In other embodiments of the invention, the down converters (or mixtures of down converters) can include Y$_2$O$_3$; Li (5%). This material can be synthesized from Y(NO$_3$)$_3$.6H$_2$O (99.8%), Li(NO$_3$) (99.99%), and glycine (≥99%) purchased from Sigma-Aldrich and used with or without further purification. HPLC-grade H$_2$O can be used (Fisher Chemicals). [Y$_2$O$_3$; Ln]. [Y$_2$O$_3$; Li (5%)] can be synthesized by a solution combustion synthesis involving glycine as the fuel. The reaction is as follows;

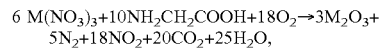

$$6\,M(NO_3)_3 + 10NH_2CH_2COOH + 18O_2 \rightarrow 3M_2O_3 + 5N_2 + 18NO_2 + 20CO_2 + 25H_2O,$$

where M=Y, Yb, Er, or Li.

In a typical synthesis, 25 ml of HPLC grade H$_2$O was used to dissolve a total 0.2 mol/L of metal-nitrates and 0.3 mol/L of glycine. After stirring until dissolved fully, the reaction was placed on a hot plate set to maximum heat until combustion occurred. Powders were collected in an aluminum oxide crucible and placed in a furnace at 500° C. for 1 hour to burn off any residual nitrates.

This material is an especially well suited material for x-ray stimulated emissions in the ultraviolet to violet region of the light spectrum and may be used in power conversion systems of the invention which generate power from for example radioactive sources.

The converters in one embodiment can include a down converter including at least one of Y$_2$O$_3$; ZnS; ZnSe; MgS; CaS; Mn, Er ZnSe; Mn, Er MgS; Mn, Er CaS; Mn, Er ZnS; Mn,Yb ZnSe; Mn,Yb MgS; Mn, Yb CaS; Mn,Yb ZnS:Tb$^{3+}$, Er$^{3+}$; ZnS:Tb$^{3+}$; Y$_2$O$_3$:Tb$^{3+}$; Y$_2$O$_3$:Tb$^{3+}$, Er$^{3+}$; ZnS:Mn$^{2+}$; ZnS:Mn,Er$^{3+}$, alkali lead silicate including compositions of SiO$_2$, B$_2$O$_3$, Na$_2$O, K$_2$O, PbO, MgO, or Ag, and combinations or alloys or layers thereof.

Upconverter Structures:

As noted above, in one embodiment of the invention, the conversion film 20 can be made in the form of a thin polymer layer, in which a number of up and down conversion particles are disposed. The invention in various embodiments uses a wide variety of up conversion materials (or mixtures of up converters) to produced a particular wavelength or spectrum of light which is well suited for electricity generation from a photoelectric conversion element optically coupled to the conversion film 20. These up conversion materials can include similar materials as discussed above with regard to down conversion but typically included doped or impurity states in a host crystal that provide a mechanism for up conversion pumping. Accordingly, the up conversion materials can convert energy from one of near infrared, infrared, and microwave irradiation into light more suited for photoelectric conversion. The upconversion materials in one embodiment can convert energy from lower energy visible light to higher energy visible light more suited for photoelectric conversion. In up-conversion embodiments, light emitting particles of rare earth element complexes which emit red light may include praseodymium, light emitting particles which emit green light may include erbium, and light emitting particles which emit blue light may include thulium.

With regard more specifically to up converters suitable for the invention, U.S. Pat. No. 4,705,952 (the contents of which are hereby incorporated herein by reference) describes an infrared-triggered phosphor that stores energy in the form of visible light of a first wavelength and releases energy in the form of visible light of a second wavelength when triggered by infrared light. The phosphors in U.S. Pat. No. 4,705,952 were compositions of alkaline earth metal sulfides, rare earth dopants, and fusible salts. The phosphors in U.S. Pat. No. 4,705,952 were more specifically phosphors made from strontium sulfide, barium sulfide and mixtures thereof; including a dopant from the rare earth series and europium oxide, and mixtures thereof; and including a fusible salt of fluorides, chlorides, bromides, and iodides of lithium, sodium, potassium, cesium, magnesium, calcium, strontium, and barium, and mixtures thereof. The materials described in U.S. Pat. No. 4,705,952 are useful in various embodiments of the invention.

The synthesis of oxide nanoparticles such as those that are covered on the lanthanides have been achieved by a number of processes including solid-gel (sol-gel) techniques, gas phase condensation or colloidal chemical methods. While efforts to make concentrated colloidal solutions of highly uniform size luminescent nanoparticles have met with some technical difficulties, synthesis of useful amounts of some 5 nanometer sized lanthanide doped oxides have been achieved as shown in a paper by Bazzi et al entitled *Synthesis and luminescent properties of sub 5-nm lanthanide oxide particles*, in the Journal of Luminescence 102 (2003) pages 445-450, the entire contents of which are incorporated herein by reference. Materials such as these and the other materials discussed below are useful materials for upconversion. The work by Bazzi et al concentrated on understanding the properties on lanthanide oxide nanonparticles with an emphasis on the microstructural properties and optical emission properties (i.e. concentrated on the fluorescence and down conversion properties of these materials). Nevertheless, the materials described by Bazzi et al are useful in various embodiments of this invention.

The present inventors have realized that such up conversion and down conversion materials can be used in the conversion film 20 of the present invention. In one example of others to be described below, a nanoparticle of a lanthanide doped oxide can be excited with near infrared light such as for example light of a wavelength range greater than 1000 nm in the solar spectrum and produce visible light more tuned for the band gap of the conversion element 10. Such nanoparticles would have application in the solar concentrators discussed above.

Other work reported by Suyver et al in *Upconversion spectroscopy and properties of* $NaYF_4$ *doped with* $Er^{3+}$, $Tm^{3+}$ *and or* $Yb^{3+}$, in Journal of Luminescence 117 (2006) pages 1-12, the entire contents of which are incorporated herein by reference, recognizes in the $NaYF_4$ material system upconversion properties. The materials described by Suyver et al are useful in various embodiments of this invention.

Figure 5:
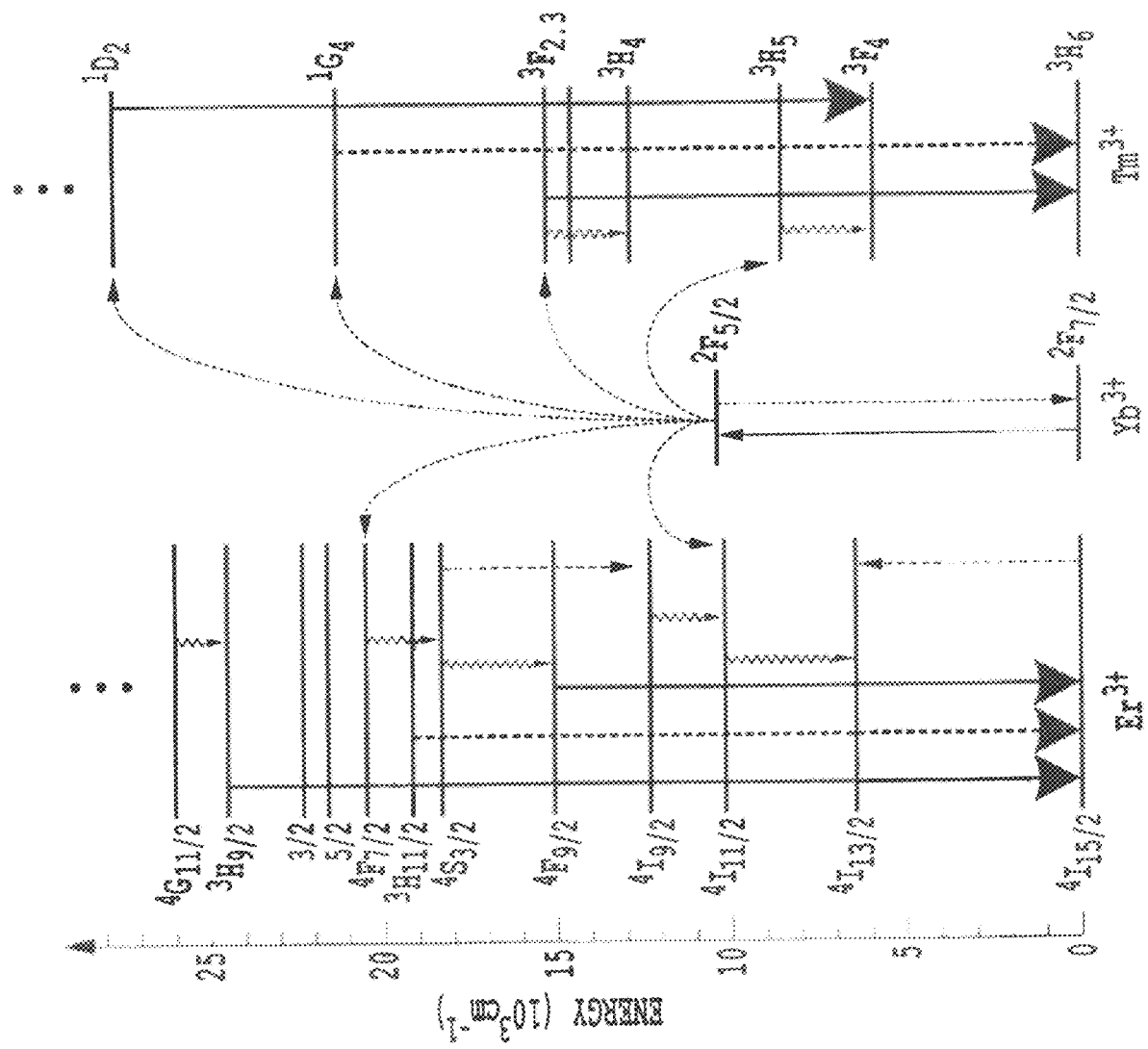
FIG. 5 is a schematic energy level diagram showing upconversion excitation and visible emissions schemes for $Er^{3+}$, $Tm^{3+}$ and or $Yb^{3+}$ ions.

FIG. 5 is a schematic reproduced from Suyver et al shows a schematic energy level diagram of upconversion excitation and visible emissions schemes for $Er^{3+}$, $Tm^{3+}$ and or $Yb^{3+}$ ions. Full, dotted, dashed, and curly arrows indicate respectively radiative, non-radiative energy transfer, cross relaxation and other relaxation processes.

The lanthanide doped oxides differ from more traditional multi-photon up conversion processes where the absorption of, for example, two photons is needed in a simultaneous event to promote an electron from a valence state directly into an upper level conduction band state where relaxation across the band gap of the material produces fluorescence. Here, the co-doping produces states in the band gap of the $NaYF_4$ such that the $Yb^{3+}$ ion has an energy state at $^2F_{5/2}$ pumpable by a single photon event and from which other single photon absorption events can populate even higher states. Once in this exited state, transitions to higher energy radiative states are possible, from which light emission will be at a higher energy than that of the incident light pumping the $^2F_{5/2}$ energy state. In other words, the energy state at $^2F_{5/2}$ of the $Yb^{3+}$ ion is the state that absorbs 980 nm light permitting a population build up serving as the basis for the transitions to the higher energy states such as the $^4F_{7/2}$ energy state. Here, transitions from the $^4F_{7/2}$ energy state produce visible emissions.

Figure 6:
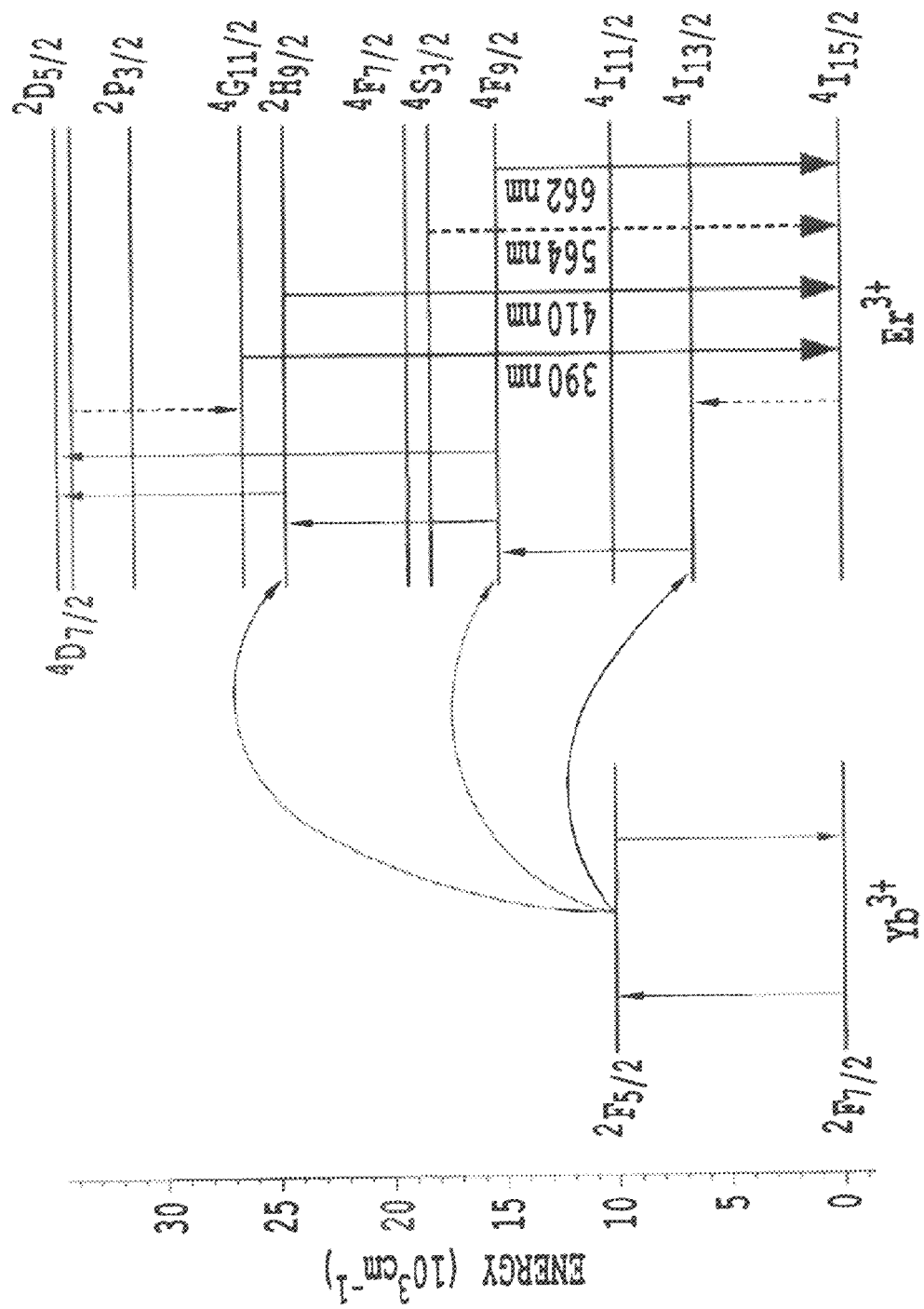
FIG. 6 is an energy diagram showing energy states for a four-photon upconversion process in $Y_2O_3$ nanocrystals.

Chen et al have described a four photon upconversion in *Four-photon upconversion induced by infrared diode laser excitation in rare-earth-ion-doped* $Y_2O_3$ *nanocrystals*, Chemical Physics Letters, 448 (2007) pp. 127-131 In that paper, emissions at 390 nm and at 409 nm were associated with a four-photon upconversion process in the $Y_2O_3$ nanocrystals. FIG. 6 reproduced below from Chen et al shows a ladder of states by which an infrared light source can progressively pump until the $^4D_{7/2}$ state is reached. From this upper state, transitions downward in energy occur until the $^4G_{1/2}$ state is reached, where a transition downward in energy emits a 390 nm photon. The materials described by Chen et al are useful in various embodiments of this invention.

U.S. Pat. No. 7,008,559 (the entire contents of which are incorporated herein by reference) describes the upconversion performance of ZnS where excitation at 767 nm produces emission in the visible range. The materials described in U.S. Pat. No. 7,008,559 (including the ZnS as well as $Er^{3+}$ doped $BaTiO_3$ nanoparticles and $Yb^{3+}$ doped $CsMnCl_3$) are suitable for use in various embodiments of this invention.

Further materials specified for up conversion in the present invention include CdTe, CdSe, ZnO, CdS, $Y_2O_3$, MgS, CaS, SrS and BaS. Such up conversion materials may include any semiconductor and more specifically, but not by way of limitation, sulfide, telluride, selenide, and oxide semiconductors and their nanoparticles, such as $Zn_{1-x}Mn_xS_y$, $Zn_{1-x}Mn_xSe_y$, $Zn_{1-x}Mn_xTe_y$, $Cd_{1-x}MnS_y$, $Cd_{1-x}Mn_xSe_y$, $Cd_{1-x}Mn_xTe_y$, $Pb_{1-x}Mn_xS_y$, $Pb_{1-x}Mn_xSe_y$, $Pb_{1-x}Mn_xTe_y$, $Mg_{1-x}MnS_y$, $Ca_{1-x}Mn_xS_y$, $Ba_{1-x}Mn_xS_y$ and $Sr_{1-x}$, etc. (wherein, $0<x\leq1$, and $0<y\leq1$). Complex compounds of the above-described semiconductors are also contemplated for use in the invention—e.g. $(M_{1-z}N_z)_{1-x}Mn_xA_{1-y}B_y$, (M=Zn, Cd, Pb, Ca, Ba, Sr, Mg; N=Zn, Cd, Pb, Ca, Ba, Sr, Mg; A=S, Se, Te, O; B=S, Se, Te, O; $0<x\leq1$, $0<y\leq1$, $0<z\leq1$). Two examples of such complex compounds are $Zn_{0.4}Cd_{0.4}Mn_{0.2}S$ and $Zn_{0.9}Mn_{0.1}S_{0.8}Se_{0.2}$. Additional conversion materials include insulating and nonconducting materials such as $BaF_2$, BaFBr, and $BaTiO_3$, to name but a few exemplary compounds. Transition and rare earth ion co-doped semiconductors suitable for the invention include sulfide, telluride, selenide and oxide semiconductors and their nanoparticles, such as ZnS; Mn; Er; ZnSe; Mn, Er; MgS; Mn, Er; CaS; Mn, Er; ZnS; Mn, Yb; ZnSe; Mn,Yb; MgS; Mn, Yb; CaS; Mn,Yb etc., and their complex compounds: $(M_{1-z}N_z)_{1-x}(Mn_qR_{1-q})_xA_{1-y}B_y$, (M=Zn, Cd, Pb, Ca, Ba, Sr, Mg; N=Zn, Cd, Pb, Ca, Ba, Sr, Mg; A=S, Se, Te, O; B=S, . . . $0<z\leq1$, $o<q\leq1$).

Up-conversion phosphors similar in chemical compositions to the down-conversion fluorescent materials discussed above can also be used. The up-conversion phosphors can include laser dyes, e.g., the organic small molecules that can be excited by the absorption of at least two infrared photons with emission of visible light. The up-conversion phosphors can include fluorescent polymers, e.g., the class of polymers that can be excited by the absorption of at least two infrared photons with emission of visible light. The up-conversion phosphors can include inorganic or ceramic particles or nano-particles, including the conventional up-conversion phosphors (e.g. metal fluorides, metal oxides) that can be excited by the absorption of at least two infrared photons with emission of visible light. The up-conversion phosphors can include semiconductor particles, including nano-particles such as II-VI or III-V compound or Group IV semiconductors, described in details in the "down-conversion" semiconductors above.

Fluorescent up-conversion inorganic phosphors can include but are not limited to metal oxides, metal halides, metal chalcoginides (e.g. sulfides), or their hybrids, such as metal oxo-halides, metal oxo-chalcoginides. Fluorescent up-conversion inorganic phosphors are usually doped with rare earth elements (e.g. $Yb^{3+}$, $Er^{3+}$, $Tm^{3+}$). Some host examples include, but are not limited to: $NaYF_4$, $YF_3$, $BaYF_5$, $LaF_3$, $La_2MoO_8$, $LaNbO_4$, $LnO_2S$; where Ln is the rare earth elements, such as Y, La, Gd).

Some nanoparticles such as $ZnS:Tb^{3+}$, $Er^{3+}$; $ZnS:Tb^{3+}$; $Y_2O_3:Tb^{3+}$; $Y_2O_3:Tb^{3+}$, $Er3+$; $ZnS:Mn^{2+}$; $ZnS:Mn,Er^{3+}$ are known in the art to function for both down-conversion luminescence and upconversion luminescence.

Figures 1, 7A:
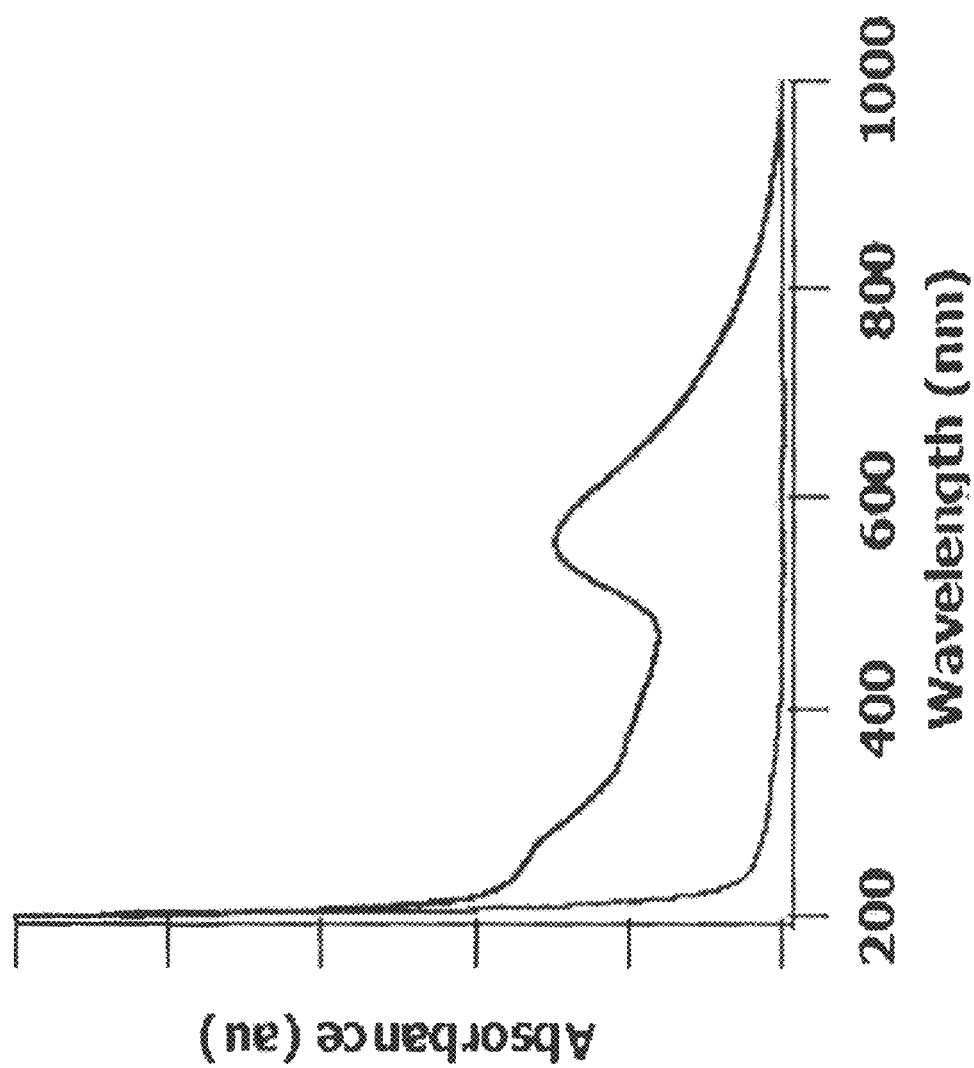
FIG. 1 schematically illustrates the basic framework of a conventional solar cell.
FIG. 7A is a schematic illustration of various upconverter structures of the invention.

FIG. 7A is a schematic of a depiction of a converter material (i.e., a photoactive material) according to one embodiment of the invention. FIG. 7A shows a number of structural configurations for placement of a dielectric core upconverter material (which is of a nanometer sized scale) in proximity to a metal shell. Incident light at a wavelength $\lambda_1$ interacts with the upconverting dielectric core. The interaction of light $\lambda_1$ with the dielectric core produces a secondary emission at a frequency $\lambda_2$ which has a shorter wavelength than $\lambda_1$ and accordingly has a higher energy than $\lambda_1$. While the exact physical mechanisms for the upconversion are critical to the invention, for the purposes for discussion and illustration, the following explanation is offered.

In the context of FIG. 7A, when a wavelength $\lambda_1$ interacts with a dielectric material core, three separate processes are well understood for the upconversion process involving trivalent rare earth ions. These three processes are:
1) excited state absorption whereby two photons are absorbed sequentially by the same ion to excite and populate one or more states;
2) energy transfer upconversion which is a transfer of excitation from one ion to another already in an excited state; and
3) a cooperative process of multiphotons where two nearby ions in excited states are emitting collectively from a virtual state.

Regardless of which one of these processes is occurring between the chosen ion(s) and the host lattice, the end result is a photon of energy greater than the excitation energy being emitted from the host lattice for the upconversion process.

Therefore, the particular ion being activated (whether it be a dopant ion or a host ion of a lattice such as in the neodymium oxide) will be chosen covered on the host material being processed, in order that the dopant ion or the host ion in the dielectric core provide ion states which are pumpable by the NIR source to generate the resultant emission $\lambda_2$.

In one embodiment of the invention, the materials for the upconverter dielectric core can include a wide variety of dielectric materials, as described above. In various embodiments of the invention, the upconverter dielectric core includes more specifically lanthanide doped oxide materials. Lanthanides include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Other suitable dielectric core materials include non-lanthanide elements such as yttrium (Y, atomic no. 39) and scandium (Sc). Hence, suitable dielectric core materials include $Y_2O_3$, $Y_2O_2S$, $NaYF_4$, $NaYbF_4$, Na-doped $YbF_3$, YAG, YAP, $Nd_2O_3$, $LaF_3$, $LaCl_3$, $La_2O_3$, $TiO_2$, $LuPO_4$, $YVO_4$, $YbF_3$, $YF_3$, or $SiO_2$. These dielectric cores can be doped with Er, Eu, Yb, Tm, Nd, Tb, Ce, Y, U, Pr, La, Gd and other rare-earth species or a combination thereof.

Lanthanides usually exist as trivalent cations, in which case their electronic configuration is (Xe) $4f^n$, with n varying from 1 ($Ce^{3+}$) to 14 ($Lu^{3+}$). The transitions within the f-manifold are responsible for many of the photo-physical properties of the lanthanide ions, such as long-lived luminescence and sharp absorption and emission lines. The f-electrons are shielded from external perturbations by filled $5s$ and $5p$ orbitals, thus giving rise to line-like spectra. The f-f electronic transitions are LaPorte forbidden, leading to long excited state lifetimes, in the micro- to millisecond range.

Accordingly, examples of doped materials in the invention include oxides such as yttrium oxide and neodymium oxide and aluminum oxide as well as sodium yttrium fluoride and nanocrystalline perovskites and garnets such as yttrium aluminum garnet (YAG) and yttrium aluminum perovskite (YAP). Of these materials, doping is required for some, but not all of these materials, for promoting upconversion efficiencies. In various embodiments of the invention, the host nanocrystals are doped with trivalent rare earth lanthanide ions from those lanthanide series elements given above.

More specifically, in various embodiments of the invention, pairs of these dopants are introduced in order to make accessible more energy states in the host crystal. The activation and pumping of these energy states follows closely the principles discussed above. Doping concentrations in the invention can range from 0.2% to 20% roughly per ion into the host lattice or in a weight or mol % variation. The efficiency of the up and down conversion processes of specific bands in these materials can be modulated by the percentages doped to induce and enhance targeted emissions. Lanthanide doped upconverters while not limited to, can use the following mol percent dopant compositions: 5% Er, 10% Yb, 0.2% Tm+3% Yb, and 1% Er+10% Yb.

The size of the nanocrystal will also have an effect on the efficiency of the upconversion process, as a larger nanocrystal will have more sites for dopant ions to be accommodated into the host lattice, therefore enabling more emissions from the same doped host than if the nanocrystal were smaller. While the dopant percentages listed above are not rigidly fixed, these numbers provide a rudimentary teachings of the typical percentages one would use in obtaining a particular dielectric core material of the invention.

Moreover, some of these host crystals (e.g., neodymium oxide) in one embodiment of the invention may require no specific doping to facilitate upconversion, which has been seen in one instance in $Nd_2O_3$ with an excitation wavelength of 587 nm producing emissions at 372 nm, 402 nm, and 468 nm. See Que, W et al. Journal of Applied Physics 2001, vol 90, pg 4865, the entire contents of which are incorporated herein by reference. Doping neodymium oxide with $Yb^{3+}$, in one embodiment of the invention, would enhance upconversion through sensitizing the $Nd^{3+}$ ions with a lower energy $Yb^{3+}$ activator.

In one embodiment of this invention, the dielectric core is coated, such as for example with a metallic shell, to enhance electron-phonon coupling and thereby increase upconversion efficiency, as discussed above. In another embodiment of this invention, the shell can include a $SiO_2$- and/or $TiO_2$-coating, and this coating is in one embodiment coated on doped $Y_2O_3$ upconverting nanoparticles to thereby, in some instances, increase the upconversion efficiency relative to an uncoated nanoparticle. Further, in one embodiment of this invention, the coating can be a polymer. In one embodiment, this coating is provided on $NaYF_4$:Ln/$NaYF_4$ dielectric core. Such coatings can increase the upconversion efficiency relative to an uncoated upconverter. Similarly, such a coating may increase the down conversion efficiency relative to an uncoated down converter.

In another embodiment of the invention, phonon modes of an undoped host-lattice (e.g., $Y_2O_3$) nanocrystals are modulated, for example, by Au, Ag, Pt, and Pd shells 4 of varying thicknesses. In various embodiments of the invention, the upconverter dielectric core and the shell system includes as upconverting nanocrystals $Y_2O_3$:Ln with $NaYF_4$ shells, $Y_2O_3$:Ln with Au(Ag,Pt) shells, $NaYF_4$:Ln with $Y_2O_3$ shells, $NaYF_4$:Ln with Au(Ag,Pt) shells. In this system, the core diameter and shell outer/inner diameter of the metallic coatings can be set to dimensions that are expected to be tunable to a plasmon mode overlap.

In other embodiments as discussed below, the metal coating or the metallic structure can exist inside the dielectric and the relative position of the metal structure to the dielectric structure can enhance plasmon resonance. These structures with the metallic structure inside can be referred to as a metallic core up converter or a metallic core down converter. The metallic core technique for energy conversion is useful since it takes advantage of metal nano-particles that have improved surface morphology compared to shell coatings on core dielectrics. The metal or metallic alloy in the inner core metallic energy converter can be selected to tune its plasmonic activity. These structures with the metallic structure outside can be referred to as a core up converter or a core down converter.

Figure 7C:
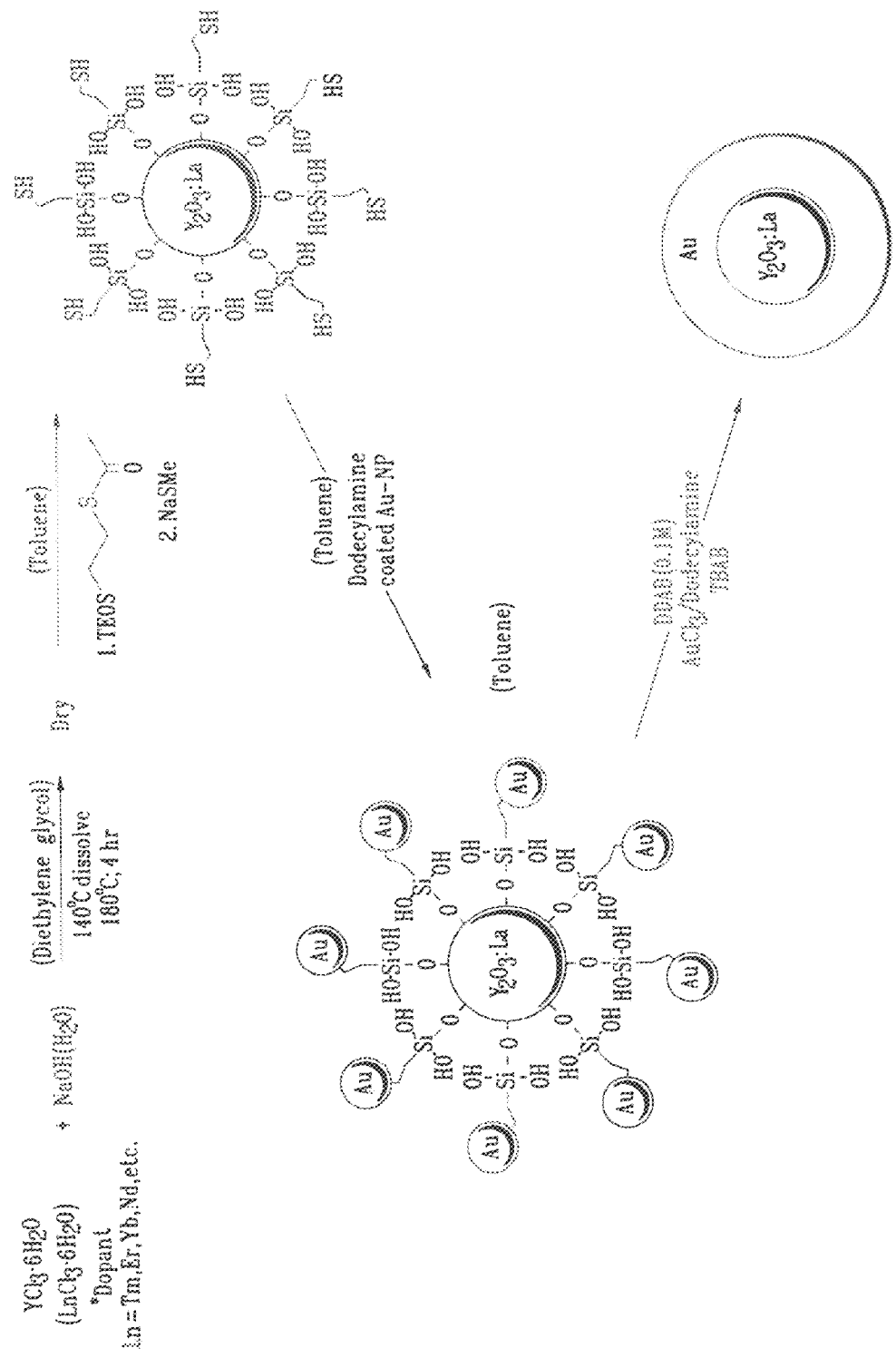
FIG. 7C is a schematic illustration of a process for forming and a resultant Ln-doped $Y_2O_3$ core with a Au shell.

FIG. 7C is a schematic illustration of a process for forming and a resultant Ln-doped $Y_2O_3$ core with a Au shell. One illustrative method for producing sub-10 nm Ln-doped $Y_2O_3$ nanoparticles with a metal shell can be achieved through the polyol method. See Bazzi, R. et al. *Journal of Luminescence,* 2003, 102-103, 445-450, the entire contents of which are incorporated by reference. In this approach, yttrium chloride hexahydrate and lanthanum-series chloride hexahydrates are combined in an appropriate ratio with respect to their cation concentration into suspension with diethylene glycol (0.2 mol chloride per liter of DEG). To this suspension is added a solution of NaOH and water (0.2 mol/L and 2 mol/L, respectively). The suspension is heated to 140° C. in a solvent recondensing/reflux apparatus for a period of 1 hour. Upon completion of the 1 hour of heating the solution has become transparent and nucleation of the desired nanoparticles has occurred. The temperature is then increased to 180° C. and the solution is boiled/refluxed for 4 hours yielding $Y_2O_3$:Ln nanoparticles. This solution is then dialyzed against water to precipitate the nanoparticles or solvent is distilled off and excess water added to precipitate the same. The nanoparticles are collected through centrifugation and dried in vacuo.

The dried nanoparticles are then calcined at 900° C. for 2 hours to afford single phase, cubic $Y_2O_3$ nanocrystals with lanthanide dopants equally distributed through the $Y_2O_3$ nanocrystal. This methodology may be modified to allow for synthesis in a pressurized environment, thereby allowing for complete expression in the cubic phase, allowing for a shorter calcining times and lower temperatures leading to less nanoparticle agglomeration and size growth.

Nanocrystals are then resuspended in toluene with sonication and treated with 2-triethoxysilyl-1-ethyl thioacetate (300 mM) in toluene. Volatile components of the reaction mixture are removed in vacuo and the remaining residue is resuspended in toluene and treated with NaSMe. Volatile components of the reaction mixture are again removed in vacuo and the remaining residue is purified through reprecipitation, centrifugation, and drying. The thiol-terminated, surface-modified nanocrystals are then resuspended in 0.1 M DDAB (didodecylammonium bromde) in toluene and a solution of colloidal gold nanoparticles (~1 nm in diameter) coated in dodecylamine (prepared as per Jana, et al. *J. Am. Chem. Soc.* 2003, 125, 14280-14281, the entire contents of which are incorporated herein by reference) is added. The gold shell is then completed, and grown to the appropriate shell thickness through additions of $AuCl_3$ and dodecylamine in the presence of reducing equivalents of tetrabutylammonium borohydride. Thiol terminated organic acids may then be added to allow for increased water solubility and the completed gold metal shell, Ln-doped, $Y_2O_3$ nanoparticles may be separated in the presence of water through extraction or dialysis.

Figure 7D:
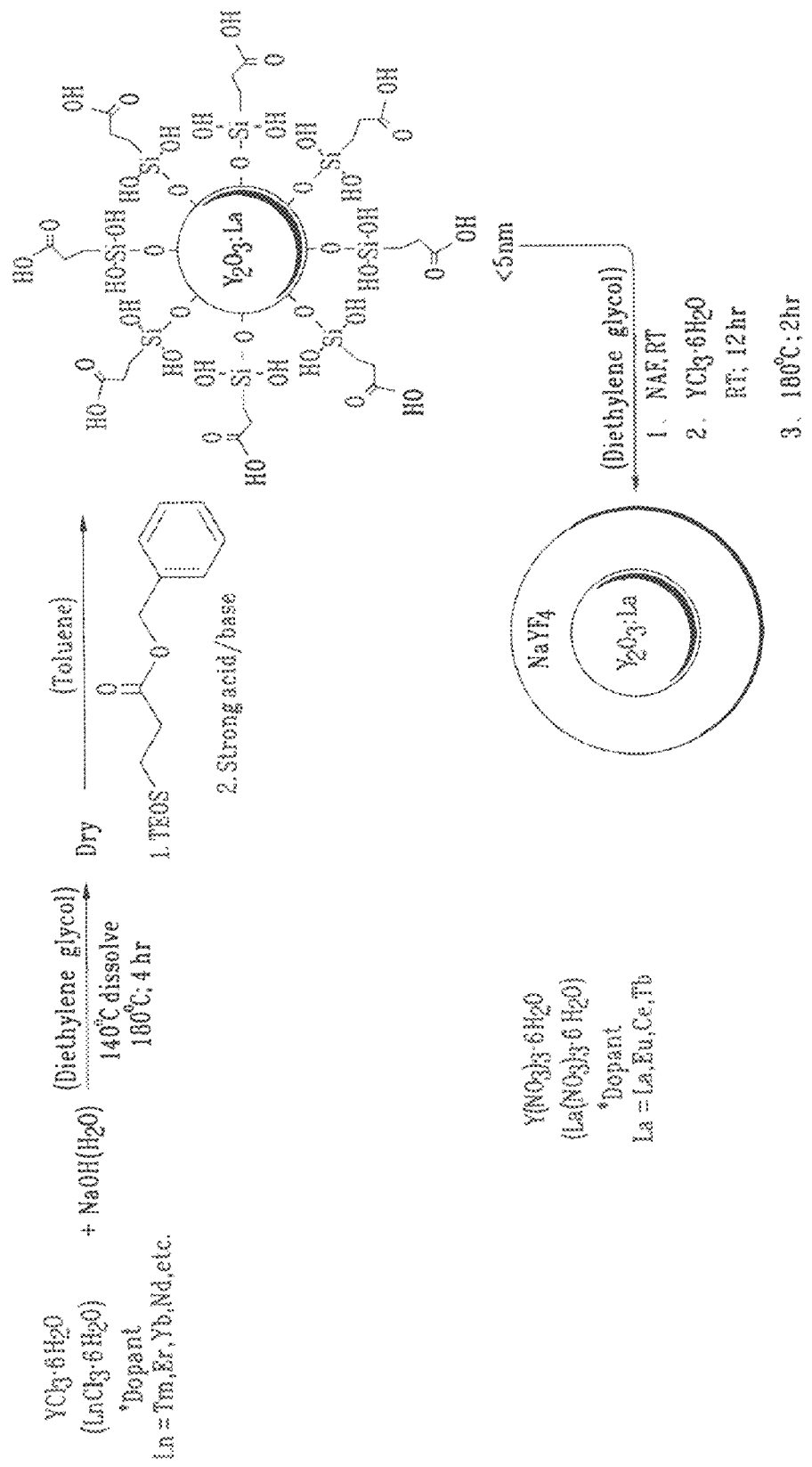
FIG. 7D is a schematic illustration of a process for forming and a resultant Ln-doped $Y_2O_3$ core with a $NaYF_4$ shell.

FIG. 7D is a schematic illustration of a process for forming and a resultant Ln-doped $Y_2O_3$ core with a $NaYF_4$ shell. In this embodiment of the present invention, Ln-doped $Y_2O_3$ cores for example may be shelled with $NaYF_4$, $Nd_2O_3$, $Ga_2O_3$, $LaF_3$, undoped $Y_2O_3$, or other low phonon mode dielectric material using a secondary polyol approach following silyl protection of the core nanocrystal. It has been shown that low phonon mode host lattices (such as $Y_2O_3$, $NaYF_4$, etc.) are useful for aiding in the upconversion process. This has been attributed to the nature of electron-phonon coupling to low phonon modes and the removal of non-radiative decay processes within the host-lattice/ion crystal. Accordingly, in one embodiment of the present invention, the dielectric core materials are made of low mode phonon host lattices (such as $Y_2O_3$, $NaYF_4$, $Nd_2O_3$, $LaF_3$, $LaCl_3$ $La_2O_3$, $TiO_2$, $SiO_2$ etc.).

Dried $Y_2O_3$ nanoparticles are resuspended in toluene with sonication and treated with 2-triethoxysilyl-1-propionic acid, benzyl ester (300 mM) in toluene. Volatile components of the reaction mixture are removed in vacuo and the remaining residue is resuspended in toluene and treated with a strong cover. Volatile components of the reaction mixture are again removed in vacuo and the remaining residue is purified through reprecipitation, centrifugation, and drying. The carboxyl-terminated, surface-modified nanocrystals are then resuspended in a solution of sodium fluoride in DEG and treated with yttrium nitrate hexahydrate at room temperature, stirring for 12 hours (for $NaYF_4$ exemplar). The reaction mixture is then brought to 180° C. for 2 hours to grow the $NaYF_4$ shell through Ostwald ripening. Nanoparticles are purified through reprecipitation, as described previously. Organic acid terminated polymers, polyethylene glycol, polyethynyleneimine, or other FDA approved, bio-available polymer may then be added to allow for increased water solubility and the completed $NaYF_4$ shell, Ln-doped, $Y_2O_3$ nanoparticles may be resuspended in water for medical use.

In various embodiments of the invention, the upconverter dielectric core can be coated with thiol-terminated silanes to provide a coating of $SiO_2$ about the core of similar reactivity to $Y_2O_3$. These thiolated nanoparticles are then exposed to colloidal Au (1-2 nm) which associates to the nanoparticle surface and, with addition of $HAuCl_4$ and a reducing agent, Ostwald ripening coalesces the Au surface into a uniform shell of a designated thickness. Solubility enhancement of $NaYF_4$ and other $CaF_2$ lattices can be increased by the use of coupled trioctylphosphine-oleic amine, polyethylene glycol, and polyethyleneimine surfactants. These surfactants associate to the surface of the nanoparticles with functional head groups and are soluble in either organic or aqueous solvents to permit colloidal suspension of the nanoparticles.

In one embodiment of the invention, this methodology is used to synthesize upconverting core-shell nanoparticles of $Y_2O_3$:Ln with $NaYF_4$ shells, $Y_2O_3$:Ln with Au(Ag,Pt) shells, $NaYF_4$:Ln with $Y_2O_3$ shells, $NaYF_4$:Ln with Au(Ag, Pt) shells where core and shell diameters varying from 2 to 20 nm. In these material systems, the tuned ratio of core-to-shell diameter may permit a plasmon-phonon resonance which should amplify absorption of NIR light and/or upconverted emission. In these material systems, control of the core and shell diameters is one factor determining the size dependent effect and subsequent tuning of plasmon-phonon resonance.

In one embodiment of the invention, this methodology is used to synthesize novel mixed core-shell materials can include semiconducting $Y_2O_3$ and $NaYF_4$ cores doped with various Ln series metals, which have been shown to possess large upconverting efficiencies. These doped $Y_2O_3$ and $NaYF_4$ cores will have shells of Au(Ag,Pt, Pd) or undoped $Y_2O_3$ and $NaYF_4$ matrices which have the potential to enhance or tune the phonon modes needed for energy transfer in the upconversion process. Solubility can be enhanced, for example, by addition of thiolated organics (Au shell), organic chain triethanolsilane ($Y_2O_3$ shell), and trioctylphospine-oleic amine ($NaYF_4$ shell). All core-shell nanoparticles may further be solubilized into a colloidal suspension with the addition of triarginine peptide, polyethylene glycol, and polyethyleneimine surfactants.

Figure 8:
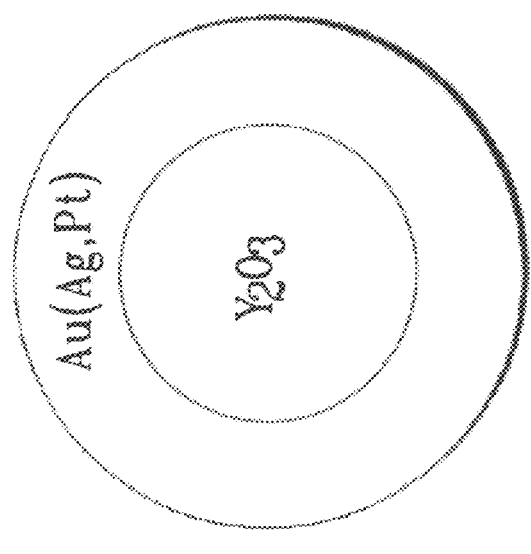
FIG. 8 is a schematic illustration of a particular nanometer sized upconverter structure of the invention.

In one embodiment of the invention, small nanocrystals of these materials are prepared using rare-earth (RE) precursors (e.g. chloride, nitrate, alkoxides) which are mixed with a defined amount of water in a high boiling polyalcohol (e.g., diethylene glycol) solvent. The dehydrating properties of the alcohol and the high temperature of the solution promote a non-aqueous environment for the formation of oxide particles, as opposed to hydroxide, particles. Other solvents which can be used include: ethylene glycol, triethylene glycol, propylene glycol, dipropylene glycol, tripropylene glycol, etc. (thereby providing solvents with different boiling points). With these procedures, one expects sub-5 nm nanocrystals to be coated with Au, Ag, Pt, Pd (or combinations thereof) layers. FIG. 8 illustrates one such coated sub-5 nm nanocrystal.

Accordingly, the synthesis of these nanocrystals and other dielectric core elements can follow the methods described below.

In particular, one method of forming yttrium oxide nanocrystals is to obtain precursors of the yttrium and rare earth ions in their salt forms, preferably in a chloride salt of the hexahydrate form, which is more soluble than non-hexahydrate forms. These salts are then combined in the correct molar ratios as listed below to create a yttrium oxide containing solution in a high boiling polyalcohol solvent with an added cover of the correct proportion. An initial cation concentration of 0.2 moles per liter is mixed with a sodium hydroxide solution in water (0.2 moles per liter of sodium hydroxide per liter of reaction solution; 2 moles of $H_2O$ per liter per solution). The precursors were added together in the polyalcohol solvent, stirred for one hour at 140° C. After the salts are completely dissolved, the solution is brought to reflux at 180° C. and heated for four hours. The reaction is then cooled to room temperature yielding a transparent colloidal suspension of rare earth doped, yttrium oxide nanocrystals. The metallic shell can then be prepared using the processes described below.

Similar methods can be employed for the preparation of the other upconversion materials described above, such as for example for the preparation of 1) nanoparticles of 2% neodymium and 8% ytterbium doped yttrium oxide, 2) europium and ytterbium doped yttrium oxide, and 3) any combination of rare earth trivalent ions doped into a neodymium oxide nanocrystal.

FIGS. 9A-9D show some of the various embodiments of converter structures of the invention that can be designed: (a) a structure including upconverter (UC) molecules bound to a metal (gold) nanoparticle; (b) a structure including an UC-containing nanoparticle covered with metal nanoparticles, (c) a metal nanoparticle covered with an UC-containing nanocap; (d) an UC-containing nanoparticle covered with metal nanocap, (e) a metal nanoparticle covered with UC nanoshell, (f) an UC-containing nanoparticle covered with metal nanoshell, (g) an UC-containing nanoparticle covered with metal nanoshell with protective coating layer.

Accordingly, FIG. 9A represents embodiments of the invention where the dielectric core is supplemented with a shell. The shell can include a metal layer of a prescribed thickness. The metal layer can include materials such as nickel, gold, iron, silver, palladium, platinum and copper and combinations thereof. The shell functions as a plasmonic shell where surface plasmons can form in the metal between the dielectric core and the outer environment acting as an exterior dielectric. The shell (as shown) may not be a complete shell. Partial metallic shells or metallic shells of varying thicknesses are also acceptable in the invention.

Figure 9B:
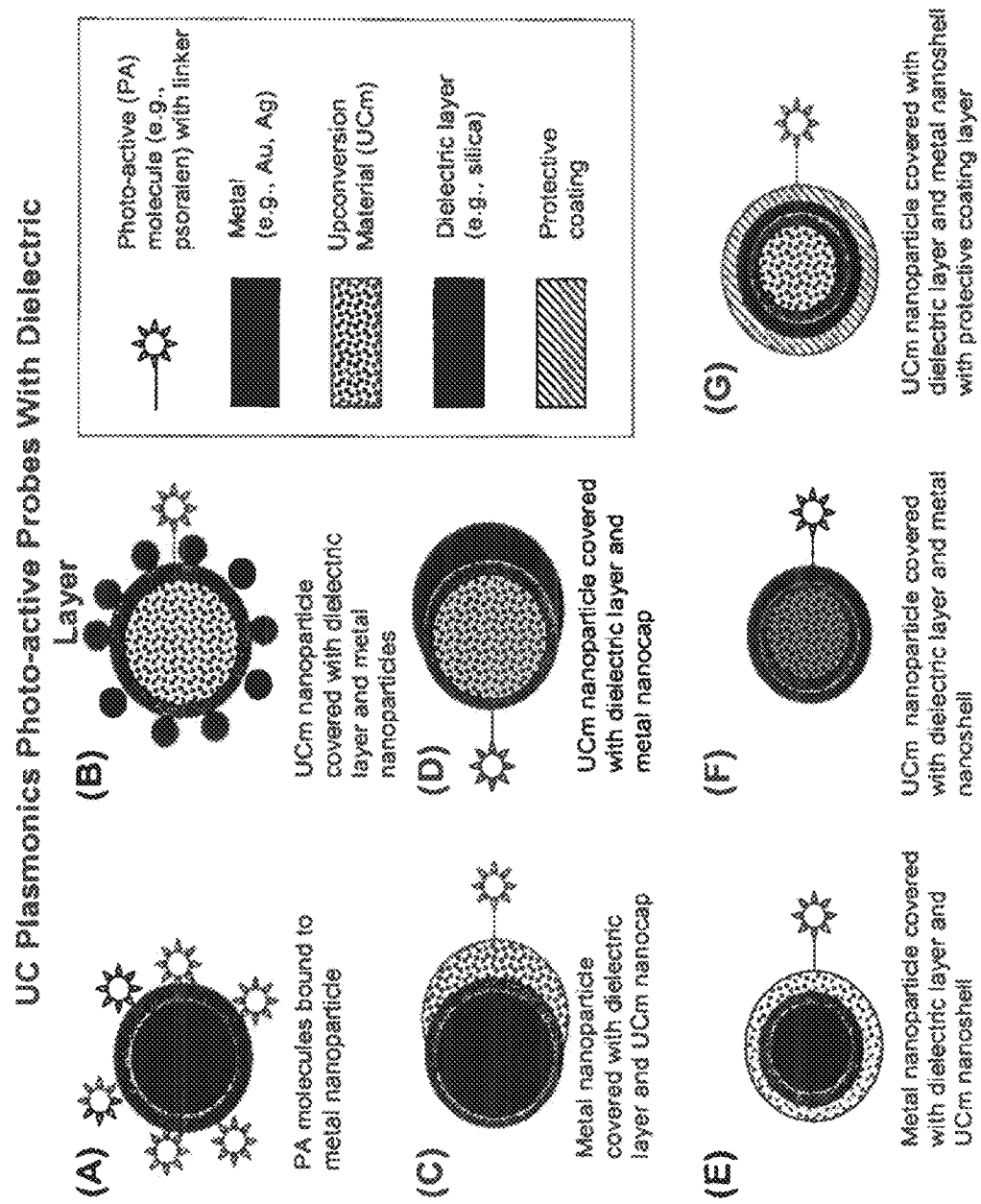
FIG. 9B is another schematic illustration of other various upconverter structures of the invention.

FIG. 9B shows yet other embodiments of conversion structures that have a dielectric layer between the metal and the UC materials.

Figure 9C:
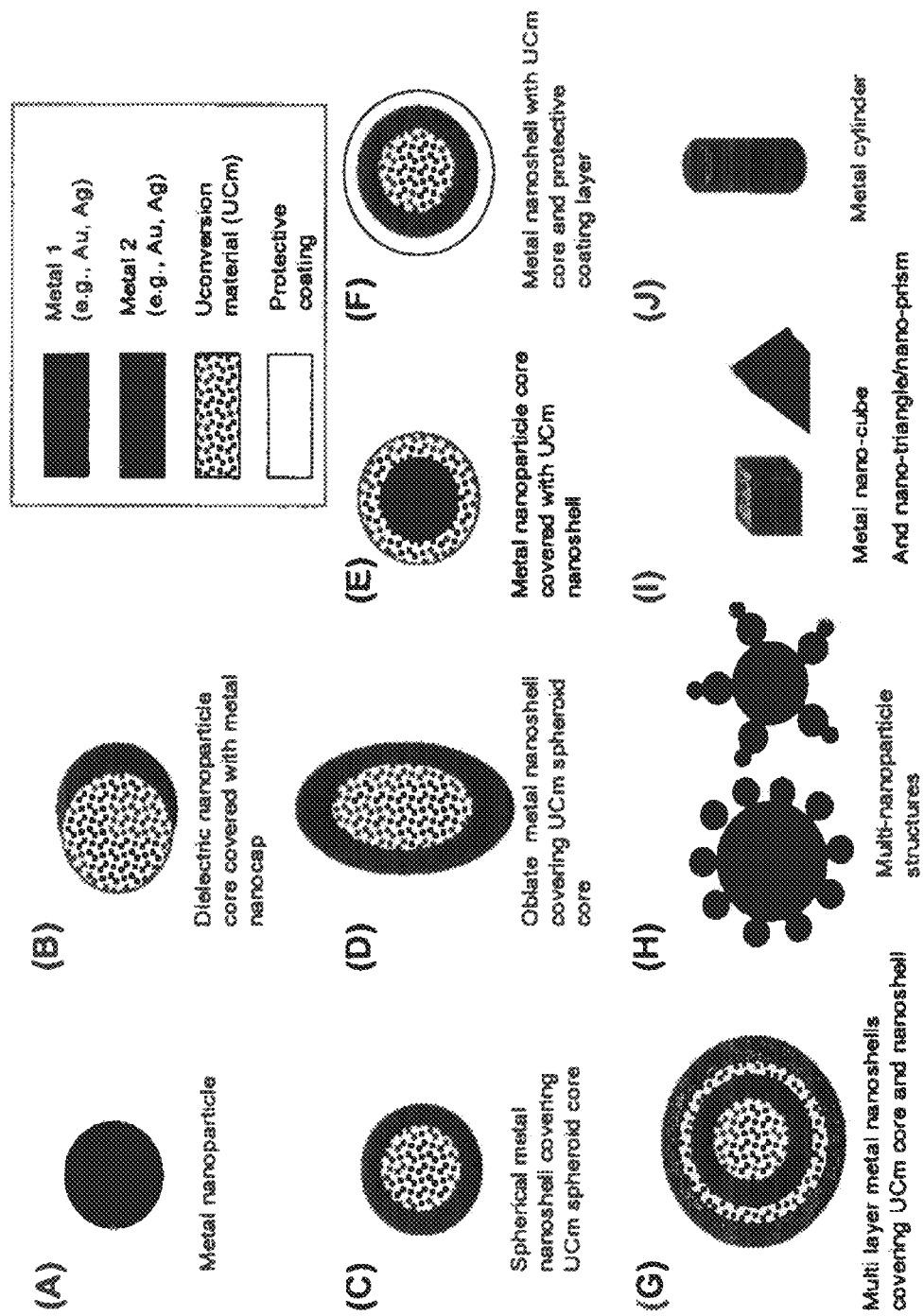
FIG. 9C is a schematic illustration of plasmonics-active upconverter structures of the invention.

FIG. 9C shows still further embodiments of plasmonics-active nanostructures having upconverting (UC) materials that can be designed: (a) a metal nanoparticle, (b) an UC nanoparticle core covered with metal nanocap, (c) a spherical metal nanoshell covering an UC spheroid core, (d) an oblate metal nanoshell covering UC spheroid core, (e) a metal nanoparticle core covered with UC nanoshell, (f) a metal nanoshell with protective coating layer, (g) multi layer metal nanoshells covering an UC spheroid core, (h) multi-nanoparticle structures, (i) a metal nanocube and nanotriangle/nanoprism, and (j) a metal cylinder.

Figure 9D:
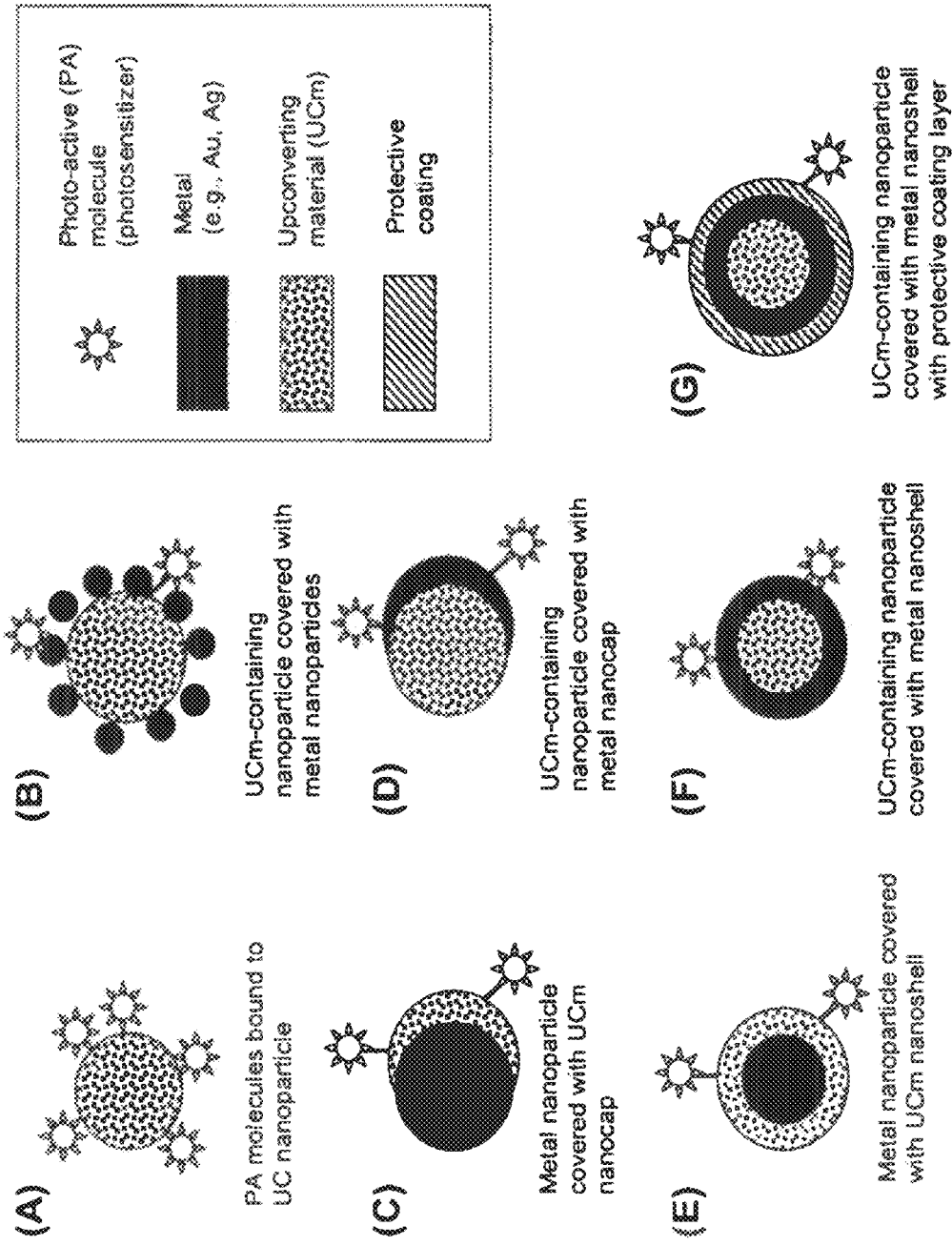
FIG. 9D is a schematic illustration of other plasmonics-active upconverter structures of the invention.

FIG. 9D shows yet other embodiments of plasmonics-active nanostructures having upconverting materials with linked photo-active (PA) molecules that can be designed. For example, the length of the linker between the PA molecule and the UC material or the metal surface is tailored such that it is sufficiently long to allow the PA molecules to be active and short enough to allow efficient excitation of light from the UC to efficiently excite the PA molecules. FIG. 9D shows (a) PA molecules bound to an UC nanoparticle, (b) an UC material-containing a nanoparticle covered with metal nanoparticles, (c) a metal nanoparticle covered with UC material nanocap, (D) an UC material-containing nanoparticle covered with metal nanocap, (e) a metal nanoparticle covered with an UC material nanoshell, (f) an UC material-containing nanoparticle covered with metal nanoshell, (g) an UC material-containing nanoparticle covered with metal nanoshell with protective coating layer.

Gold nanoshells can be prepared using the method described in Hirsch L R, Stafford R J, Bankson J A, Sershen S R, Price R E, Hazle J D, Halas N J, West J L (2003) *Nanoshell-mediated near infrared thermal therapy of*

*tumors under MR Guidance.* Proc Natl Acad Sci 100:13549-13554, the entire contents of which are incorporated herein by reference. This method uses a mechanism involving nucleation and then successive growth of gold nanoparticles around a dielectric core. Gold nanoparticles and the seed can be prepared using the Frens method to grow the gold shell. Dielectric nanoparticles (100 nm or less) used for the core of the nanoshells can then be monodispersed in solution of 1% APTES in EtOH. The gold "seed" colloid can then be synthesized using the Frens method to deposit gold onto the surface of nanoparticles via molecular linkage of silyl terminated, amine groups. The "seed" covers the aminated nanoparticle surface, first as a discontinuous gold metal layer gradually growing forming a continuous gold shell.

In a further embodiment of the invention, the upconverter structures of the invention can be incorporated into a material (e.g., biocompatible polymer) that can form a nanocap onto the metal (gold) nanoparticles. Suitable gel or biocompatible polymers include, but are not limited to poly(esters) covered on polylactide (PLA), polyglycolide (PGA), polycarpolactone (PCL), and their copolymers, as well as poly(hydroxyalkanoate)s of the PHB-PHV class, additional poly(ester)s, natural polymers, particularly, modified poly(saccharide)s, e.g., starch, cellulose, and chitosan, polyethylene oxides, poly(ether)(ester) block copolymers, and ethylene vinyl acetate copolymers.

Neodymium oxide is a novel dielectric nanostructural material that can also be synthesized by the same polyalcohol method described above with regard to yttrium oxide nanocrystal preparation. Doped neodymium oxide is expected to also show upconversion processes. Neodymium oxide as a host structure possesses lower optical phonon modes than all other oxide covered materials. Lower frequency of phonon may be best suited for electronic transfer between ions. In general, phonon modes are vibrations in a crystal lattice whose frequencies are dependent on the crystal lattice structure and materials. Energy released by upconversion (effectively atomic emission) is transmitted through the photons. With photons, energy can be transferred via Forster, Dexter, or photon capture pathways. Meanwhile, for holes and electrons, charge tunneling is one mechanism for energy transfer. For photons, lower phonon modes typically exhibit less destructive interference, thereby being more suitable for upconverted emission. Accordingly, in one embodiment of the invention, the lower energy phonon modes for neodymium oxide are expected to provide for a stronger electron phonon coupling transfer to occur between the dopants inside of the neodymium oxide. Neodymium oxide has also shown the same low toxic effects as yttrium oxide.

Accordingly, the upconversion emitters of this invention involve a number of configurable structures and materials which will permit their use in a variety of photoelectric conversion applications. Further, many of the dielectric cores described in the invention for up conversion also exhibit down conversion properties.

In general, the upconversion process generally requires one of more rare-earth dopants, such as Er, Eu, Yb, Tm, Nd, Tb, Ce, Y, U, Pr, La, Gd and other rare-earth species or a combination thereof, doped into a dielectric crystal (of any size >0.1 nm), including at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$, where incident radiation is at longer wavelength than emissive radiation from the crystal. The wavelength emitted in based entirely on the dopant ion(s) chosen and their associated and relative concentration in the host crystal. For the example of upconversion in a $Y_2O_3$ host crystal, to achieve a blue emission (~450-480 nm), one could synthesize [$Y_2O_3$; Yb (3%), Tm (0.2%)], where the Yb and Tm are the percentages doped in the crystal relative to the Y atoms being 100%. Likewise, typical green upconversion materials are [$Y_2O_3$; Yb (5%), Ho (1%)] and [$Y_2O_3$; Yb (2%), Er (1%)], and typical red upconversion materials are [$Y_2O_3$; Yb (10%), Er (1%)] and [$Y_2O_3$; Yb (5%), Eu (1%)].

Up-conversion of red light with a wavelength of about 650 nm in $Tm^{3+}$ doped flourozirconate glasses can be used in the invention to produce blue light. In this system, the blue light consists of two emission bands; one at 450 nm which is ascribed to the 1D2→3H4 transition, the others at 475 nm is ascribed to the 1G4→3H6 transition. For glasses with a $Tm^{3+}$ concentration of 0.2 mol % and greater, cross-relaxation processes occur which decrease the up-conversion efficiency. The emission of blue light (while not optimum) can still be used by the photoelectric conversion element of this invention to produce electricity, whereas without up conversion the red or infrared or otherwise below band gap light would lead only to waste heat upon absorption in the photoelectric conversion element.

The emission of visible light upon excitation in the near-infrared (NIR) has been observed in optically clear colloidal solutions of $LuPO_4$:$Yb^{3+}$, $Tm^{3+}$, and $YbPO_4$:$Er^{3+}$ nanocrystals in chloroform. Excitation at 975 nm has been shown by others to produce visible luminescence in the blue, green, or red spectral regions.

Tellurium and germanium oxides (tellurites and germinates) are also suitable upconverters. These glasses can be doped with Tm, Yb, Ho, Er, Pr, for example. $Yb^{3+}$ doped $BaZrO_3$ is also suitable for upconversion. $Er^{3+}$ and/or $Tm^{3+}$ doping is also suitable for tailoring the emission wavelengths.

In another embodiment, $Nd^{3+}$:$Cs_2NaGdCl_6$ and $Nd^{3+}$, $Yb^{3+}$:$Cs_2NaGdCl_6$ polycrystalline powder samples prepared by Morss method have been reported to be up converters and are suitable for this invention. These materials, under 785 nm irradiation, have shown upconversion emissions near 538 nm (Green), 603 nm (Orange), and 675 nm (Red) were observed and assigned to 4G7/2→4I9/2, (4G7/2→4I11/2; 4G5/2→4I9/2), and (4G7/2→4I13/2; 4G5/2→4I11/2), respectively.

In another embodiment, $Nd^{3+}$ and $Ho^{3+}$ co-doped-based $ZrF_4$ fluoride glasses under 800 nm excitation have been reported to be up converters and are suitable for this invention. Among the up-conversion luminescences for the $ZrF_4$ fluoride glasses, the green emission was seen to be extremely strong, and the blue and red emission intensities were very weak.

In another embodiment, $Tm^{3+}$/$Yb^{3+}$-codoped $TeO_2$—$Ga_2O_3$—$R_2O$ (R=Li, Na, K) glasses have been reported to be up converters and are suitable for this invention. These materials, under excitation at 977 nm, showed intense blue upconversion emission centered at 476 nm along with a weak red emission at 650 nm. Once again, the emission of blue light (while not optimum) can still be used by the photoelectric conversion element of this invention to produce electricity, whereas without up conversion the red or infrared or otherwise below band gap light would lead only to waste heat upon absorption in the photoelectric conversion element.

In another embodiment, metal-to-ligand charge transfer (MLCT) transition in [Ru(dmb)$_3$]$^{2+}$ (dmb=4,4'-dimethyl-2, 2'-bipyridine) in the presence of anthracene or 9,10-diphenylanthracene have been reported to be up converters and are suitable for this invention. Upconverted singlet fluorescence resulting from triplet-triplet annihilation at low excitation power has been reported. In particular, 9,10-diphenylanthracene (DPA) (substituted for anthracene) showed higher efficiencies for upconversion.

Converter Structures:

This invention in various embodiments uses a wide variety of up and/or down conversion materials (or mixtures of up and down converters) to produce a particular wavelength or a spectrum of light which is well suited for electricity generation from one or photoelectric conversion elements optically coupled to the conversion film 20. In various embodiments, the mixtures of up and down converters can include a first plurality of particles which upon radiation from a radiant source at a first radiation energy radiate at a higher energy than the first radiation energy. In various embodiments, the mixtures of up and down converters can include a second plurality of particles which upon radiation from the radiant source at a second radiation energy radiate at a lower energy than the second radiation energy.

Moreover, the first and second radiation energies need not be (but can be) the same wavelength of energy. In the case of different wavelengths for the first and second radiation energies, the power conversion devices can include tandem conversion devices with respective ones of the conversion devices designed to produce electricity from the different wavelengths.

Hence, the present invention in one embodiment provides a conversion system for producing light of an energy more readily converted by conversion element 10. The system includes one or more nanoparticles configured, upon exposure to a first wavelength $\lambda_1$ of radiation, to generate a second wavelength $\lambda_2$ of radiation having a higher or lower energy than the first wavelength $\lambda_1$. The system includes a metallic shell encapsulating at least a fraction of the nanoparticles. In one embodiment of the invention, a radial dimension of the metallic shell is set to a value where a surface plasmon resonance in the metallic shell resonates at a frequency which provides spectral overlap with either the first wavelength $\lambda_1$ or the second wavelength $\lambda_2$.

In another embodiment, the present invention provides a nanoparticle structure including a sub 10 nm dielectric core and a metallic shell encapsulating at least a fraction of the nanoparticle. The dielectric core includes at least one of $Y_2O_3$, $NaYF_4$, YAG, YAP, or $Nd_2O_3$. Such nanoparticle structures can exhibit in certain embodiments surface plasmon resonance in the metallic shell to enhance upconversion of light from a first wavelength $\lambda_1$ to a second wavelength $\lambda_2$.

As described above, shell is in particular designed with a layer thickness to enhance the photon upconversion process through plasmonic enhancement. The thickness of the shell is "tuned" in its thickness to the absorption process by having a dimension in which plasmons (i.e., electrons oscillations) in shell have a resonance in frequency which provides spectral overlap with the absorption band of the incident light targeted. Thus, if the upconversion is to be stimulated by NIR light such as for example centered around 1000 nm NIR light, then the thickness of the shell is "tuned" in a thickness to where a plasmon resonance resonates at a frequency also of 1000 nm (or in the neighborhood thereof as plasmon resonances are typically broad at these wavelengths).

Such a plasmon resonating shell can be made of numerous transition metals, including though not limited to gold, silver, platinum, palladium, nickel, ruthenium, rhenium, copper, and cobalt. When formed of a gold nanoshell, the recommended thickness to resonate with 980 nm light is approximately 3.5 nm surrounding an 80 nm upconverting core, as projected by extended Mie theory calculations. (See Jain et al., *Nanolett.* 2007, 7(9), 2854 the entire contents of which are incorporated herein by reference.) FIG. 7A-1 is reproduced from Jain et al and illustrates the capability in the present invention to "tune" the metal shell to have a spectral overlap with the excitation and/or emission radiation wavelengths. This capability of matching or tuning of the frequencies provides an enhancement of the absorption which would not be present with a dielectric core alone.

In one embodiment of this invention, the thickness of the metal shell is set depending on the absorption frequency (or in some cases the emission frequency) of the particular dopant ions in the dielectric core to enhance the total efficiency of the emission process of the upconverted light. Accordingly, the thickness of the shell can be considered as a tool that in one instance enhances the absorption of $\lambda_1$, and in another instance can be considered as a tool that enhances the emission of $\lambda_2$, or in other situations can be considered an enhancement feature that in combination enhances the overall conversion process.

Additionally, plasmon-phonon coupling may be used to reduce a resonance frequency through the tuning of the bands to a degree off resonance. This may be useful in optimizing resonance energy transfer processes for the purpose of coupling the core-shell nanoparticles to sensitive chromophores or drug targets. Accordingly, when a recipient is outside of the shell, the recipient will receive enhanced light $\lambda_2$ by the above-described plasmonic effect than would occur if the shell were absent from the structure.

Accordingly, with the upconverter or down converter structures of this invention, a plasmonics effect is advantageous. A plasmonics effect can occur throughout the electromagnetic region provided the suitable nanostructures, nanoscale dimensions, metal types are used. Plasmonic effects are possible over a wide range of the electromagnetic spectrum, ranging from gamma rays and X rays throughout ultraviolet, visible, infrared, microwave and radio frequency energy. However, for practical reasons, visible and NIR light are used for metal structures such as for example silver and gold nanoparticles, since the plasmon resonances for silver and gold occur in the visible and NIR region, respectively.

The converter structures of this invention include in various embodiments nanoparticles of neodymium and ytterbium doped yttrium oxide, europium and ytterbium doped yttrium oxide, and any combination of rare earth trivalent ions doped into a neodymium oxide nanocrystal. The dual doped yttrium oxide of composition neodymium and ytterbium and also the dual doped europium and ytterbium are new for the yttrium oxide host lattice, although such dual doped systems have been shown to work in other host lattices such as YAG.

These dual doped lanthanide glasses have been shown to upconvert efficiently on bulk materials, and thereby can provide new upconverter structures at the nano-scale. There are a number of advantages offered by these yttrium oxide naonstructures of the invention. The small scale synthetic methodology for creating nanoscale yttrium oxide is easier to control and produce in yttrium oxide than in YAG.

In one embodiment of this invention, a dual dopant permits excitation of either ion in the host glass. For instance, excitation by 980 nm light excites a ytterbium ion, where through transfer of energy from one excited state of the ytterbium ion to another dopant provides a mechanism for upconversion emission of light in the visible spectral region.

Accordingly, this invention can use a wide variety of up conversion and down conversion materials and alternatively mixtures of different up conversion materials and/or mixtures of different down conversion materials. These conversion materials can include quantum dots, semiconductor materials, scintillation and phosphor materials, materials that exhibit X-ray excited luminescence (XEOL), organic solids, metal complexes, inorganic solids, crystals, rare earth materials (lanthanides), polymers, scintillators, phosphor materials, etc., and materials that exhibit excitonic properties.

Indeed, in one example, for power conversion, the energy source need not be the Sun.

The energy source can be from a radiation source such as a Cobalt 60 source whose gamma radiation is converted to visible light for photoelectric conversion. Other sources include a Cesium-137 source, an Iridium-192 source, a Krypton-85 source, a Radium-226 source, and a Strontium-90 source. Further, as noted above, the high energy radiation source may come from an active nuclear core generating power in an electric plant.

Indeed, in another example, for power conversion, the energy source can be from a radiation source such as a waste heat source from a combustion process whose infrared radiation is to be converted to visible light for photoelectric conversion. Presently, many conventional steam plants driving electric generators use combustion burners to provide the energy to convert water into steam. Infrared radiation from these sources generally is wasted into the environment where air conditioning or other means to moderate the temperature have to be used. With the present invention, a part of the radiated heat would be captured, converted to visible-type light and the converted to electric power.

Thus, the first problem encountered in solar cell conversion is that the Sun is a broad spectrum source while the basic semiconductor p-n junction is a device where there is an optimum energy (i.e., the semiconductor band gap) for the generation of an electron-hole pair. This presents a power matching problem, where a large part of the solar spectral is not converted into electric power. Higher energy light above the band gap makes an electron hole pair, but the excess energy is converted into heat. Lower energy light below the band gap is not converted and only results in heating of the solar cell conversion material. Moreover, the heat generated reduces the efficiency of the solar cell. Especially, in approaches where the sun light is being concentrated or there is no ready way to cool the solar cell assemblies, reduced efficiency due to waste heat affects solar cell performance.

As shown above, for a silicon solar cell assembly, the maximum sensitivity because the energy band structure of the monocrystalline silicon is at or near the bandgap Eg of 1.21 ev, which corresponds to the wavelength of $\lambda=950$ nm. On the other hand, the silicon solar cell assembly is virtually non-responsive to the ultraviolet ($\lambda<400$ nm), i.e. silicon cannot efficiently convert this ultraviolet light.

As noted above, Naum et al in U.S. Pat. Appl. Publ. No. 2009/0156786 describe a transparent light conversion film including phosphor materials added to increase the overall efficiency of converting the incident solar light into electricity. Specifically, Naum et al focused on the problem that, when the sunlight reaches the earth, about 6~8% of the energy is ultraviolet. The energy carried by ultraviolet cannot be absorbed by a solar cell to generate electric energy. Moreover, this energy degrades and heats up the solar cell assembly, resulting in damaging the assembly and lowering its efficiency. Naum et al used a transparent phosphor powder which absorbed the ultraviolet in the wavelength $\lambda<400$ nm and re-radiated red light in the wavelength range $\lambda=500~780$ nm, thereby generating extra electricity and enhancing the conversion efficiency of the solar cell assembly. Naum et al thus used a singular type down conversion phosphor in their process to convert higher energy light to a lower energy light that was closer to that which the crystalline silicon cell would optimally convert.

Yet, in one embodiment of this invention, nanotechnology engineering can permit a wide degree of engineering to permit nanostructures to be fabricated into sophisticated optical components whose optical transfer function can be tailored to more closely match the optical input needed by the underlying photoelectric conversion element.

In one embodiment of this invention, conversion materials and/or mixtures of these conversion materials are applied to solar cells included in solar concentrator units where for example 1000 sun intensities are present. In one embodiment of the invention, these conversion materials and/or mixtures of these conversion materials include up converters which do not require as high a power flux in order to exhibit up conversion. These more efficient conversion materials can also be applied to solar cells, and may or may not be included in solar concentrator units. Regardless of approach, another level of solar cell efficiency increase can be expected when the IR and/or NIR part and/or visible part of the solar light is converted to a light more optimized to the fundamental energy of the solar cell converter itself (i.e., to more closely match the optical input needed by the underlying photoelectric conversion element).

In one embodiment of this invention, a light conversion device such conversion film 20 has first converters configured to emit, upon exposure to an energy source, light at a first wavelength in response to absorption of energy across a first band of wavelengths, and has second converters configured to emit, upon exposure to the energy source, light at a second wavelength in response to absorption of energy across a second band of wavelengths.

In this embodiment, a power conversion device such as conversion element 10 is a conversion device designed with an optimum excitation wavelength, and the first wavelength and the second wavelength (generated by the first and second converters) are matched to the optimum excitation wavelength. By matching, the light generated by the first and second converters is within +/−20%, and more preferably +/−10%, and more preferably +/−5%, and more preferably +/−2%, and more preferably +/−1% of the optimum excitation wavelength.

In another embodiment of this invention, a light conversion device such conversion film 20 has first converters configured to emit, upon exposure to an energy source, light at a first wavelength in response to absorption of energy across a first band of wavelengths, and has second converters configured to emit, upon exposure to the energy source, light at a second wavelength in response to absorption of energy across a second band of wavelengths.

In this embodiment, a power conversion device such as conversion element 10 comprises plural conversion devices designed with respective optimum excitation wavelengths; and the first wavelength and the second wavelength are matched to the respective optimum excitation wavelengths. By matching, the light generated by the first and second converters is within +/−20%, and more preferably +/−10%, and more preferably +/−5%, and more preferably +/−2%, and more preferably +/−1% of a respective one of the optimum excitation wavelengths.

Moreover, the ability to form nanostructures of different elemental doped crystals and the ability to form controlled shells of metallic, semiconductive, and insulating materials on conversion materials provide other solar converter designs for the invention. As the nanostructures technology have developed, plasmonic shells (e.g., Au shells) have been shown to enhance optical absorption and emission and to further tailor the optical properties.

Electrons in semiconductor quantum dots tend to make transitions near the edges of the bandgap. With quantum dots, the size of the bandgap is controlled simply by adjusting the size of the dot. Because the emission frequency of a dot is dependent on the bandgap, it is therefore possible to control the output wavelength of a dot with extreme precision. In effect, it is possible to tune the bandgap of a dot, and therefore specify its "color" output.

Accordingly, in one embodiment of the invention, a composite of different size quantum dot emitters (or a composite of different down converter materials including materials better suited than quantum dots to convert ultraviolet light to more closely match the optical input needed by the underlying photoelectric conversion element) would provide another possible way to further alter the optical transfer function of a nanostructure optical component to permit a better solar match to the underlying photo-electric conversion device.

Thus, according to the invention, the advances in nanotechnology now permit nanostructure-covered optical components to have an optical transfer function which is not merely a property of the real and imaginary index of refraction components of the nanostructures, but which also is a product of the luminescent properties of the nanostructures, whose type, size, shell structure, and mix represent engineering parameters for more closely "matching" the solar spectrum to the photo-electric conversion device. This engineering capability offers the possibility to engineer an optical transfer function of a solar converter plate to more selectively transform the broad solar spectrum into energies at or near the band gap of the photoelectric element. These improvements will apply whether or not these nanostructured covered optical components are in front of an amorphous Si solar cell on a stainless steel sheet for a roof top installation, in front of a single crystal GaAs concentrator cell exposed to 1000 suns, or in front of a remote terrestrial or outer space solar cell.

As described above, a shell (or other structure) in one embodiment of this invention can be designed with a layer thickness to enhance the photon upconversion process through plasmonic enhancement. The thickness of the shell (or other physical characteristic) is "tuned" in its thickness to the absorption process by having a dimension in which plasmons (i.e., electrons oscillations) in shell have a resonance in frequency which provides spectral overlap with the absorption band targeted. Thus, if the upconversion is to be stimulated by NIR or IR light, then the thickness of the shell is "tuned" in a thickness to where a plasmon resonance resonates at these NIR or IR wavelengths.

In one embodiment of this invention, the metallic structures can be an alloy such as for example a Au:Ag alloy. The alloy content can be set to adjust the frequency of the surface plasmon resonance. In one embodiment of the invention, the metallic structures can be an alloy such as for example a Pt:Ag alloy. The alloy content can be set to adjust the frequency of the surface plasmon resonance. In one embodiment of the invention, the metallic structures can be an alloy such as for example a Pt:Au alloy. The alloy content can be set to adjust the frequency of the surface plasmon resonance.

In one embodiment of the invention, the nanoparticle can be an alloy of two or more materials. In this embodiment, the alloy can have a composition between the two or more materials which is set to a compositional value where excitation of the alloy at first wavelength $\lambda_1$ produces emission at the second wavelength $\lambda_2$. In one embodiment of the invention, the nanoparticle can be a zinc sulfide and zinc selenide alloy. In one embodiment of the invention, the nanoparticle can be a zinc sulfide and cadmium sulfide alloy.

In one embodiment of the invention, the zinc sulfide and zinc selenide nanoparticle alloy can have an alloy content set to provide a predetermined surface plasmon resonance. In one embodiment of the invention, the zinc sulfide and cadmium sulfide nanoparticle alloy can have an alloy content is set to provide a predetermined surface plasmon resonance.

Some techniques for producing nanoparticles and nanoparticle alloys which are suitable for the invention are described in the following documents, all of which are incorporated herein in their entirety: U.S. Pat. Nos. 7,645,318; 7,615,169; 7,468,146; 7,501,092; U.S. Pat. Appl. Publ. No. 2009/0315446; 2008/0277270; 2008/0277267; 2008/0277268; and WO 2009/133138.

In one embodiment of this invention, the nanoparticle can be a dielectric or semiconductor configured to generate an up converted or down converted wavelength $\lambda_2$. In one embodiment of the invention, the nanoparticle can include multiple dielectrics or semiconductors respectively configured to emit at different wavelengths for $\lambda_2$, which for example might correspond to respective cells in a cascade or tandem solar cell structure. In one embodiment of this invention, multiple nanoparticles having different dielectrics or semiconductors can be included in a mixture of the nanoparticles dispersed in the medium.

In one embodiment of this invention, the thickness of the metal shell is set depending on the absorption frequency (or in some cases the emission frequency) of the particular dopant ions in the dielectric core to enhance the total efficiency of the emission process of the down converted or upconverted light. Accordingly, the thickness of the shell can be considered as a tool that in one instance enhances the absorption of $\lambda_1$, and in another instance can be considered as a tool that enhances the emission of $\lambda_2$, or in other situations can be considered an enhancement feature that in combination enhances the overall net process.

Additionally, plasmon-phonon coupling may be used to reduce a resonance frequency through the tuning of the bands to a degree off resonance.

The plasmonic properties of various metallic structures, which have been investigated in the art and are suitable for this invention, include metallic nanoshells of spheroidal shapes [S. J. Norton and T. Vo-Dinh, "*Plasmonic Resonances of Nanoshells of Spheroidal Shape*", IEEE Trans. Nanotechnology, 6, 627-638 (2007)], oblate metal nanospheres [S. J. Norton, T. Vo-Dinh, "*Spectral bounds on plasmon resonances for Ag and Au prolate and oblate nanospheroids*", J. Nanophotonics, 2, 029501 (2008)], linear chains of metal nanospheres [S. J. Norton and T. Vo-Dinh, "*Optical response of linear chains of metal nanospheres and nanospheroids*", J. Opt. Soc. Amer., 25, 2767 (2008)], gold nanostars [C. G. Khoury and T Vo-Dinh, "*Gold Nanostars for Surface-Enhanced Raman Scattering: Synthesis, Characterization and Applications*", J. Phys. Chem C, 112, 18849-18859 (2008)], nanoshell dimmers [C. G. Khoury, S. J. Norton, T. Vo-Dinh, "*Plasmonics of 3-D Nanoshell Dimers Using Multipole Expansion and Finite Element Method, ACS Nano*, 3, 2776-2788 (2009)], and multi-layer metallic nanoshells [S. J. Norton, T. Vo-Dinh, "*Plasmonics enhancement of a luminescent or Raman-active layer in a multilayered metallic nanoshell*", *Applied Optics*, 48, 5040-5049 (2009)]. The entire contents of each of the above noted references in this paragraph are incorporated herein by reference. In various embodiments of this invention, multi-layer metallic nanoshells discussed in this application have the potential capability to enhance electromagnetically two spectral regions. Accordingly, the metallic structures of the invention can be used in the upconverting mode to enhance both the excitation at wavelength $\lambda_1$ and the emission at wavelength $\lambda_2$ This feature also can be used in the down converting to enhance primarily the emission at wavelength $\lambda_2$ and potentially the excitation at wavelength $\lambda_1$.

Such metallic structures in various embodiments of this invention include conducting materials made for example of metals, or doped glasses or doped semiconductors. These conducting materials can be in the form of pure or nearly pure elemental metals, alloys of such elemental metals, or layers of the conducting materials regardless of the constituency. The conducting materials can (as noted above) include non-metallic materials as minor components which do not at the levels of incorporation make the composite material insulating.

Similarly, in various embodiments of the invention, the up or down converting materials can include at least one of a dielectric, a glass, or a semiconductor. The up or down converting materials can include an alloy of two or more dielectric materials, an alloy of two or more glasses, or an alloy of two or more semiconductors.

In one embodiment, a mixture of converters can include a first material configured to emit a first wavelength in response to absorption of ultraviolet light and a second material configured to emit a second wavelength in response to absorption of near infrared or infrared light. The second wavelength can be substantially the same color as the first wavelength. The mixture of converters can include a third material configured to emit a third wavelength in response to absorption of the ultraviolet light. The third wavelength can be different from the first wavelength and the second wavelength or the same color as the first wavelength and the second wavelength. Alternatively or in addition, the mixture of converters can include a third material configured to emit a third wavelength in response to absorption of the infrared light. The third wavelength can be different from the first wavelength and the second wavelength or the same color as the first wavelength and the second wavelength.

The converters can be a dielectric up converter including at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof. The dielectric up converter can have a particle diameter ranging from at least one of 2-1000 nm, 2-100 nm, 2-50 nm, 2-20 nm, or 2-10 nm. The dielectric up converter can include a dopant of at least one of Er, Eu, Yb, Tm, Nd, Tb, Ce, Y, U, Pr, La, Gd and other rare-earth species or a combination thereof. The dopant can have a concentration of 0.01%-50% by mol concentration. A metallic structure can be disposed in relation to the dielectric up converter, and the metallic structure includes at least one of Au, Ag, Cu, Ni, Pt, Pd, Co, Ru, Rh, Al, Ga, or a combination of alloys or layers thereof. The metallic structure can be a metallic shell including at least one of a spherical shell, an oblate shell, a crescent shell, or a multilayer shell. The dielectric up converter can be configured to exhibit visible emission upon interaction with NIR light.

Solar Cell and Power Converters:

Using up converters and down converters to capture more sun energy in this invention make use of the intensity and efficacy with which ultra-nano particles in the configurations shown above perform conversion.

In one embodiment of the invention, ultra-nano-materials (e.g., below 10 nm) can be phosphorescent or fluorescent and are able to take portions of the sun's spectral output and match it with a photovoltaic PV cell input without scattering and shadowing effects. Significant down conversion efficiencies from UV to green light can be achieved and the ultra-nano-materials can be tunable through the proper doping to other wavelength outputs.

This breakthrough is significant and is backward compatible and adaptable to various PV installed panels of different technologies including crystalline silicon, polycrystalline silicon, amorphous silicon single junction (aSi (1x)), amorphous silicon tandum junction (aSi (2x)), amorphous silicon triple junction (aSi (3x)), CdTe and CIGS cells.

These nano converters can be surface treated to both tune and further intensify light outputs. Phosphorescent and fluorescent ultra-nano-materials that are surface treated (or coated as discussed in detail above) add another degree of control over both color and intensity.

The conversion modules of the invention including the phosphorescent and fluorescent ultra-nano-materials described herein are applicable to multiple entry points across a spectrum of potential end users. Specifically, these conversion modules are applicable to residential, commercial and solar farms.

Figure 10A:
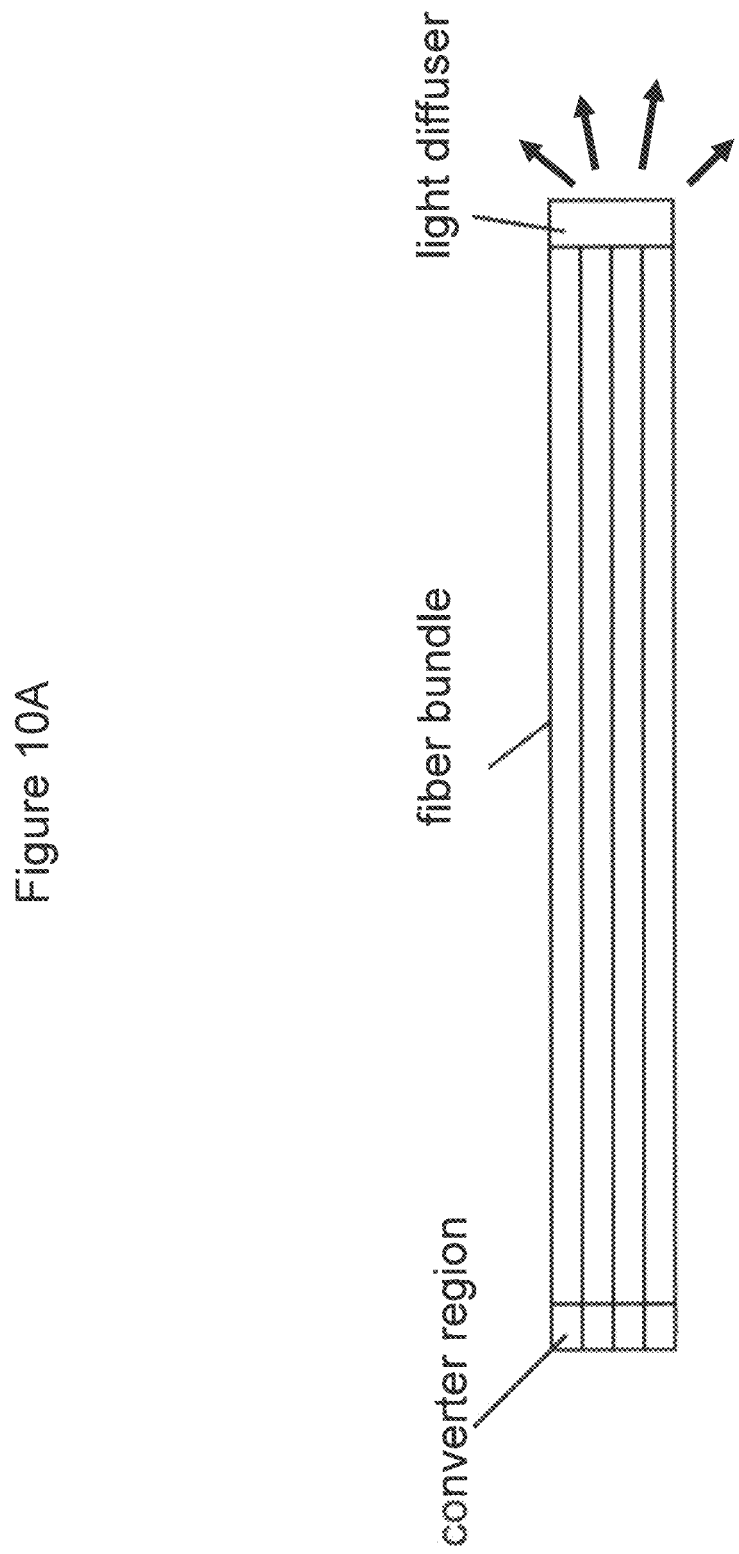
FIG. 10A is a schematic illustration of a fiber bundle of the invention showing an input converter section including the converters of the invention.

Moreover, these conversion modules have utility in hybrid lighting applications for residential and commercial users. Natural sunlight along with the traditional electric lighting can be converted to brighter light for interior spaces or light more suited to the human eye perception. In one embodiment, a fiber bundle with nano particles at their input can be used to concentrate the sunlight spectrum into a spectrum of energy more suited for white light illumination, to thereby enhance interior lighting. FIG. 10A is a schematic illustration of a fiber bundle of the invention showing an input converter section including the converters of the invention. In one embodiment, the optical fibers are routed into an interior space (which may or may not be close to windows). In one embodiment, these fiber bundles can be coupled with rods or flat screen to diffuse the light for illumination of the interior space.

Figure 10B:
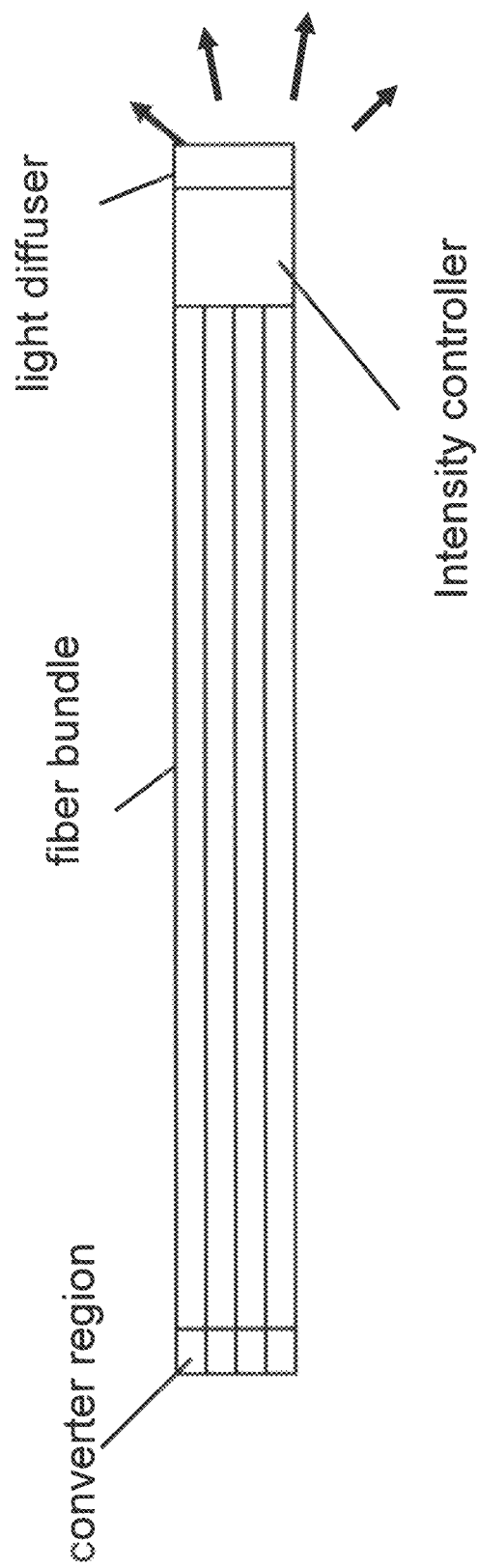
FIG. 10B is a schematic illustration of a fiber bundle of the invention showing a controller to stabilize light emission.

In one aspect of this invention, the fiber bundles of the invention provide for a nominally heat free light source, as compared to directed "pure" sun light into a building where significant amounts of infrared light is transmitted with the visible. In this aspect, the fiber bundles of the invention provide for a significant energy savings against air conditioning cost. The light sources in one embodiment of the invention have boosted light intensity outputs by virtue of the plasmonic effects discussed above, and can be made available at the workplace as well as residential areas. This would help alleviate the net cost of electricity. The light inside the interior spaces carried in by the fiber bundles of the invention, in one embodiment, can be regulated and modulated, using simple controllers. FIG. 10B is a schematic illustration of a fiber bundle of the invention showing a controller to stabilize light emission. In this embodiment, the controller can lower the intensity transmitted into the interior space so that the combined light source and fiber bundle have a stable output in a work place or so that the lighting level can be dimmed if needed.

Figure 10D:
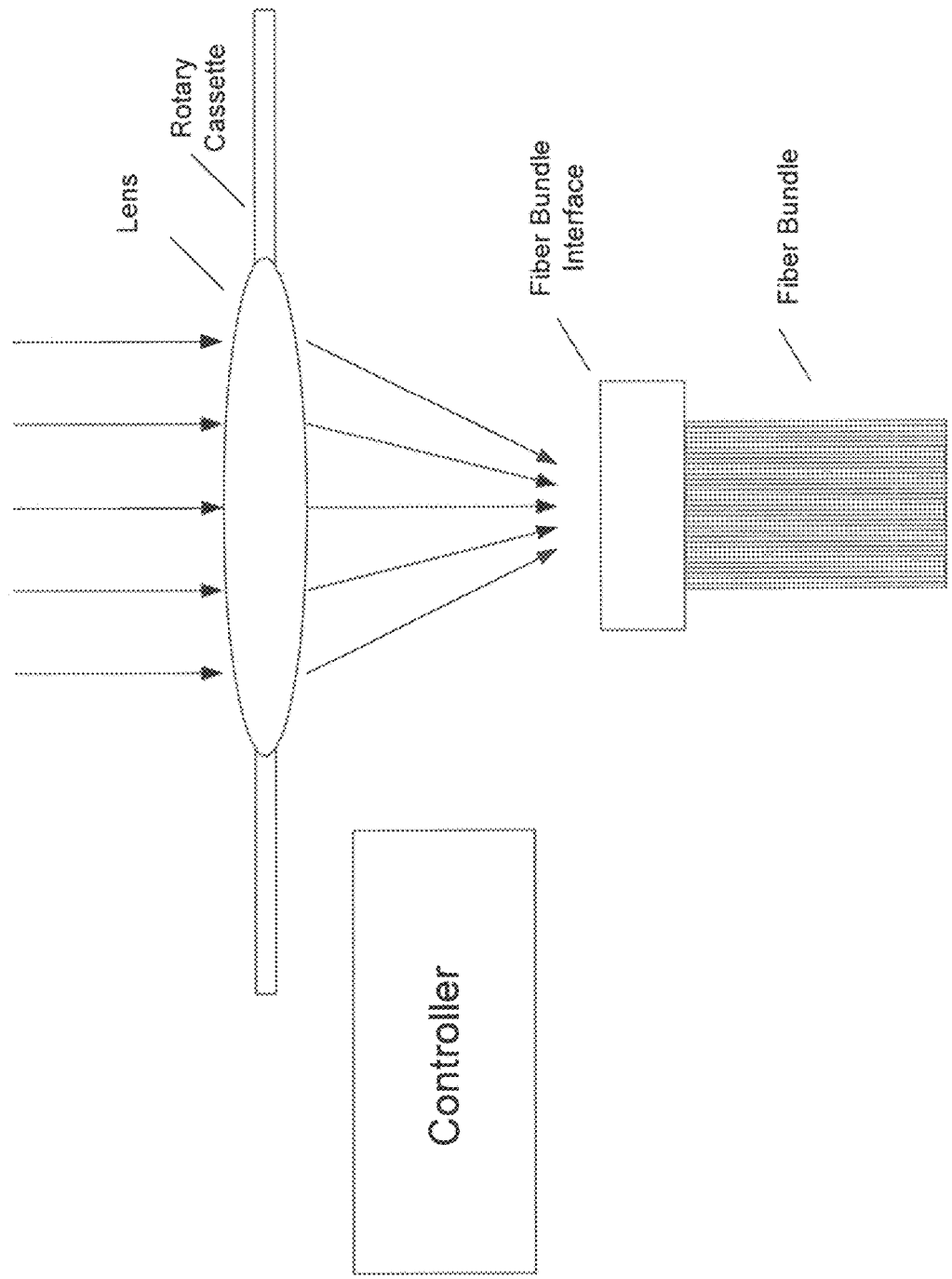
FIG. 10D is a schematic illustration showing a side view of the rotary cassette of FIG. 10C.

In one embodiment of the invention, solar panels (e.g. on a roof top) can be made to combine electricity generation and fiber light bundling functions so that, in one embodiment, a fully integrated panel can be produced (including a power converter and a light converter). FIG. 10C is a schematic illustration of another embodiment where a light control mechanism, including for example a rotary cassette, is placed proximate to a solar panel level and includes multiple apertures for modifying light entering a fiber bundle. FIG. 10D is a schematic illustration showing a side view of the rotary cassette of FIG. 10C. In one embodiment, a controller may control the elements of the rotary cassette described below.

In one embodiment, the light control mechanism of FIGS. 10C and 10D is placed at the power converter or solar panel level. In one embodiment, the rotary cassette has multiple apertures, although a single aperture and an optical light block could be used. Each aperture modifies light in color, intensity, or path in order to direct altered or unaltered light into the fiber bundle. In one embodiment, one aperture in the rotary cassette is left unpopulated to have no influence of sun light prior to entering the fiber bundle. In one embodiment, the intensity can be modulated up and down by using a lens in one case and an attenuation filter in another case. In one embodiment, a color feeding the fiber bundle can be changed by a color filter. In one embodiment, a photo-chromic filter can be added to change and modulate light. In one embodiment, an electro-optic filter can be added to change the attenuation or the polarization of the light. In one embodiment, the electro-optic filter can be triggered by a switch connected to a circuit electrically connected to the electro-optic material.

The rotary cassette is but one mechanism of altering the light characteristics. Altering of the light characteristics can be controllable, in one embodiment, through a programmable interface accessible by an end user. In turn, in one embodiment, the control interface can be in communication with a wireless network. Remote control and light alteration are therefore made possible.

While described with respect to the control of solar light distribution, in one embodiment, the light control mechanism of FIGS. 10C and 10D can be used to distribute light from non-solar light sources, such as for example, a centralized bank of halogen lamps, arc-lamps, or LED light sources. FIG. 10E is a schematic illustration of a system for lighting distribution from solar or non-solar energy sources. FIG. 10E shows that light or radiation from a solar or non-solar energy source can also be directed to a power converter (e.g., a solar cell or solar cell array).

As shown in FIG. 10E, light or radiation from a solar or non-solar energy source is directed to a light controller with or without a converter. The light controller/converter in one embodiment can include the above-described light control mechanism. The light controller/converter in one embodiment can include a spectrum or color converter (e.g., using the up and/or down converters of this invention described above). Light from the light controller/converter is directed to a fiber bundle interface and then distributed to various "rooms" as shown. Here, the use of the word "rooms" designates some lighted compartment or area lighted separately or in one embodiment lighted from multiple ones of the fiber bundles. A controller as shown can be used to control for example the power to the non-solar light source and/or to control a rotary cassette included in the In another embodiment, a fiber bundle would interface with the Sun in its inputs and yield e.g. green light in its output (for aesthetic viewing purposes). The various fibers can then be optically coupled to a glass screen (covering up to the size of a wall) to diffuse green light over the entire wall. Similarly, another fiber bundle doped with fluorescent nano-materials in their input can be built and directed to the same or different wall.

The aesthetic lighting is an attractive, value adding attribute for both residential and commercial properties. Moreover, with the combined embodiment shown above, the cost of panel installation will be amortized by these two independent uses.

The introduction of renewable and environmentally friendly sources of energy hinges, among others, on their cost and reliability in comparison to standard energy sources. Competition over the next 15 years is with traditional means of electricity generation (i.e. coal, natural gas, nuclear). Furthermore, the cost of solar energy/PV will be compared to other renewable form of energy including wind, geothermal, hydroelectric and tide and ocean current.

Ultimately, the cost of electricity (i.e.; $/kWh) is the final metric with which to gauge the competitiveness of solar PV technologies.

The PV market itself fragments into various technologies that are briefly highlighted in the current document. All of these leading PV candidates have two common areas for improvement: light trapping and the potential to convert more of the available sunlight spectrum into useable electricity.

The nano particles and materials discussed above are expected to convert UVA (close to 7%) of the sun output into useable energy at the Si-junction level.

The PV market is also impacted but the competitive offering of the existing technologies with emphasis on: (1) module cost per watt, (2) system cost per watt profiles (which factors in the maintenance in the field) and (3) the levelized cost of electricity (LCOE) compared to grid pricing. Crystalline silicon is the dominant technology; however, amorphous silicon offers much better scalability potential over time. Thin film technologies include (1) single junction amorphous silicon (a-Si 1x) on glass (2) dual junction amorphous silicon (a-Si 2x) on glass, (3) triple junction amorphous silicon (a-Si 3x) on a flexible stainless steel substrate, (4) cadmium telluride (CdTe) on glass, (5) copper indium gallium selenium (CIGS) on glass, and (6) CIGS on a flexible stainless steel substrate.

A summary of the cost per watt per module time over time for the various PV technologies is provided in the Table of FIG. 11.

The nano particles and materials discussed above are expected to boost the efficiency of the PV technologies by 5% to 9% depending whether both up and down conversion are used.

To understand better the efficacy of the nano particles and materials discussed above to boost the efficiency of the PV technologies, remember that the Sun is a broad spectrum source while the basic semiconductor p-n junction is a device where there is an optimum energy (i.e., the semiconductor band gap) for the generation of an electron-hole pair. This presents a power matching problem, where a large part of the solar spectral is not converted into electric power. Higher energy light above the band gap makes an electron hole pair, but the excess energy is converted into heat. Lower energy light below the band gap is not converted and only results in heating of the solar cell conversion material. Moreover, the heat generated reduces the efficiency of the solar cell. Especially, in approaches where the sun light is being concentrated or there is no ready way to cool the solar cell assemblies, reduced efficiency due to waste heat effects solar cell performance.

As discussed above, advances in nanotechnology now permit nanostructures to be fabricated into sophisticated optical components whose optical transfer function can be tailored to more closely match the optical input needed by the underlying photoelectric conversion element. Moreover, the ability to form nanostructures of different elemental doped crystals and the ability to form controlled shells of metallic, semiconductive, and insulating materials on conversion materials (as detailed above) provides opportunities for solar converter improvement, including but not limited to the plasmonic shells and effects discussed above. The plasmonic effect offers the capability of matching or tuning a specific particle emitter to provide an enhancement of the absorption (and/or the emission) properties of conversion materials which would not be present without the plasmonic shell structure.

Thus, in short, the advances in nanotechnology now permit nanostructure-based optical components to have an optical transfer function which is not merely a property of the real and imaginary index of refraction components of the nanostructures, but which also is a product of the luminescent properties of the nanostructures, whose type, size, shell structure, and mix represent engineering parameters for more closely "matching" the solar spectrum to the photoelectric conversion device. This engineering capability offers the possibility to alter the optical transfer function of a solar converter plate to more selectively transform the broad solar spectrum into energies (e.g., a spectrum of energies) at or near the band gap of the photoelectric element. These improvements of the invention will apply whether or not these nanostructured based optical components of the invention are in front of an amorphous Si solar cell on a stainless steel sheet for a roof top installation, or in front of a single crystal GaAs concentrator cell exposed to 1000 suns, or in front of a remote terrestrial or outer space solar cell.

Numerous modifications and variations of the invention are possible in light of the above teachings. It is therefore to be understood that within the scope of the appended claims, the invention may be practiced otherwise than as specifically described herein.

The invention claimed is:

1. A power conversion system for production of electric power, comprising:
a light-to-electric power conversion device which produces the electric power upon illumination, wherein the light-to-electric power conversion device is a silicon photovoltaic cell; and
a light conversion device thereon, wherein the light conversion device comprises an upconverting particle having a dielectric core comprising an optionally doped nanocrystalline perovskite;
wherein the optionally doped nanocrystalline perovskite converts a first part of solar radiation into a wavelength shifted part, and wherein the silicon photovoltaic cell converts at least the wavelength shifted part into electricity.

2. The system of claim 1, wherein the nanocrystalline perovskite comprises a dopant including at least one of Er, Eu, Y, Yb, Tm, Nd, Tb, Ce, or a combination thereof.

3. The system of claim 2, wherein the nanocrystalline perovskite is yttrium aluminum perovskite (YAP).

* * * * *